US009741843B2

(12) United States Patent
Nishimura

(10) Patent No.: US 9,741,843 B2
(45) Date of Patent: Aug. 22, 2017

(54) SEMICONDUCTOR DEVICE

(71) Applicant: FUJI ELECTRIC CO., LTD., Kawasaki-shi (JP)

(72) Inventor: Takeyoshi Nishimura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/963,199

(22) Filed: Dec. 8, 2015

(65) Prior Publication Data

US 2016/0211361 A1 Jul. 21, 2016

(30) Foreign Application Priority Data

Jan. 15, 2015 (JP) ................. 2015-005811

(51) Int. Cl.
*H01L 29/66* (2006.01)
*H01L 29/78* (2006.01)
*H01L 29/423* (2006.01)
*H01L 29/08* (2006.01)

(52) U.S. Cl.
CPC ...... *H01L 29/7805* (2013.01); *H01L 29/7813* (2013.01); *H01L 29/7815* (2013.01); *H01L 29/0865* (2013.01); *H01L 29/42368* (2013.01); *H01L 29/66734* (2013.01)

(58) Field of Classification Search
None
See application file for complete search history.

(56) References Cited

U.S. PATENT DOCUMENTS

| 2009/0096489 A1* | 4/2009 | Ying ................. H02M 1/32 327/103 |
| 2009/0189219 A1 | 7/2009 | Shinbori et al. |
| 2011/0012195 A1* | 1/2011 | Momota ............ H01L 29/7815 257/334 |

FOREIGN PATENT DOCUMENTS

| JP | 2009-182113 A | 8/2009 |
| JP | 2012-253391 A | 12/2012 |

* cited by examiner

*Primary Examiner* — Calvin Choi
(74) *Attorney, Agent, or Firm* — Rabin & Berdo, P.C.

(57) ABSTRACT

A semiconductor device in which current sensing accuracy is maintained while ruggedness of a current sensing region is improved. The semiconductor device includes a semiconductor substrate; a main element provided on the semiconductor substrate and having a first trench gate structure including a first trench disposed on a first main surface side of the semiconductor substrate; a gate insulating film disposed along an inner wall of the first trench; and a gate electrode disposed inside the first trench; and a current detecting element for detecting a current flowing into the semiconductor substrate when the main element is operating provided on the semiconductor substrate and having a second trench gate structure including a second trench disposed on the first main surface side of the semiconductor substrate; the gate insulating film disposed along an inner wall of the second trench; and the gate electrode disposed inside the second trench.

17 Claims, 18 Drawing Sheets

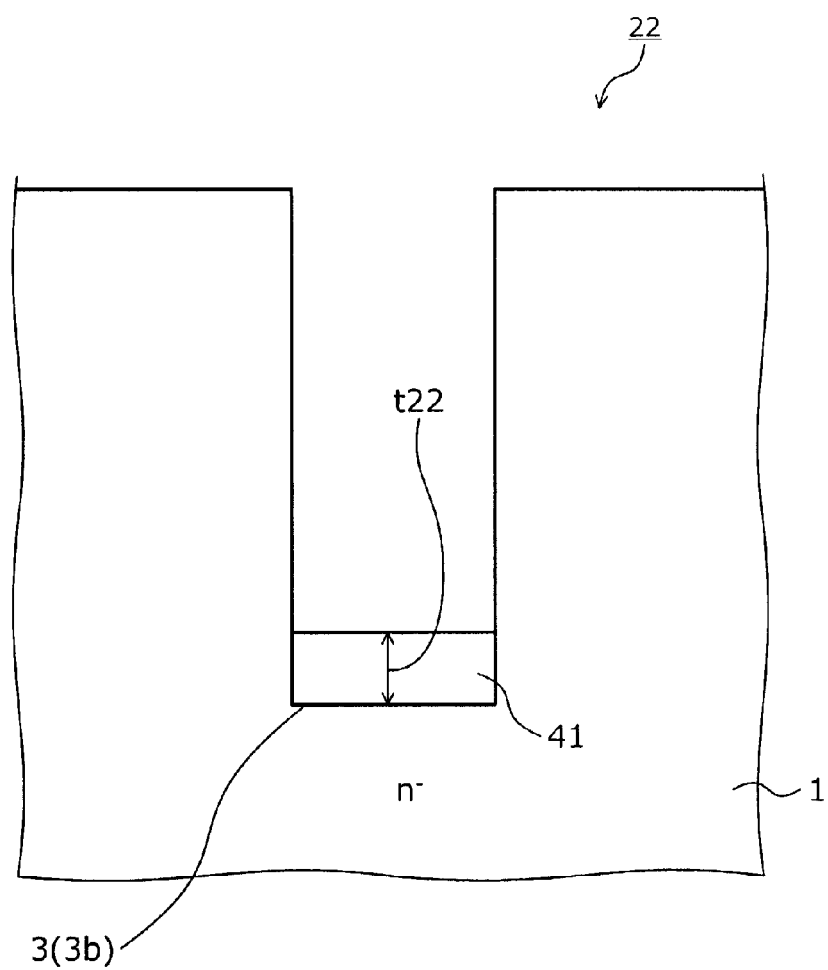

SEMICONDUCTOR DEVICE

CROSS-REFERENCE TO RELATED APPLICATION(S)

This non-provisional Application for a U.S. Patent claims the benefit of priority of JP PA 2015-005811 Jan. 15, 2015, the entire contents of which is hereby incorporated by reference.

BACKGROUND OF THE INVENTION

1. Field of the Invention

The present invention relates to a semiconductor device.

2. Background of the Related Art

Enhancement of a protection function provided for preventing a semiconductor device per se from being broken down, enhancement of a current detection (current sense) function of detecting a current flowing into the semiconductor device, etc. as well as the increase of the current and the reduction of ON-resistance (low ON-state voltage) have been requested in the semiconductor device in the background art. A current sense semiconductor element (hereinafter referred to as current sense element) is an element for detecting a current flowing into a semiconductor substrate (semiconductor chip). Due to characteristics of the current sense element, the current sense element is therefore disposed on the same semiconductor substrate as a main element arranged in an active region is disposed. The current sense element has a similar cell structure to cells (element's functional units) constituting the main element. The active region is a region in which a main current flows in an ON time.

An area occupied by a region where cells constituting the current sense element are disposed (hereinafter referred to as current sense region) is determined based on a current sense ratio and reduced to be smaller than an area occupied by the active region. The current sense ratio is a conversion ratio for calculating a current actually flowing into the active region based on a current detected by the current sense element. As described above, the cells constituting the current sense element (hereinafter referred to as current sense cells) and disposed in the current sense region have the same structure as the cells (hereinafter referred to as active cells) constituting the main element and disposed in the active region. Therefore, the number of the current sense cells disposed in the current sense region is determined based on the current sense ratio.

As to the structure of the background-art semiconductor device having the current sense element which is provided on the same semiconductor substrate as the main element is disposed, an MOSFET (Metal Oxide Semiconductor Field Effect Transistor) will be described by way of example. FIG. 10 is a plan view showing a planar layout of the background-art semiconductor device. FIG. 11 is a sectional view showing a sectional structure in a cutting plane line AA-AA' of FIG. 10. A planar layout of an active region 121, a current sense region 122 and respective electrode pads is shown in FIG. 10 (the same rule is also applied to FIG. 12). The sectional structure in the cutting plane line AA-AA' passing through the active region 121 and the current sense region 122 is shown in FIG. 11.

As shown in FIG. 10, the background-art semiconductor device (hereinafter referred to as Background-Art Example 1) has the active region 121, the current sense region 122 and a termination structure portion 123 which are provided on the same semiconductor substrate. The active region 121 surrounds the current sense region 122. The termination structure portion 123 surrounds the active region 121. A boundary between the active region 121 and the current sense region 122 and a boundary between the active region 121 and the termination structure portion 123 are not shown. In the active region 121, a source electrode pad 111, a current sense electrode pad 112, and a gate electrode pad 113 are provided separately from one another on a front surface of the semiconductor substrate.

In the current sense region 122, a current sense electrode 110 is provided on the front surface of the semiconductor substrate to cover substantially the whole surface of the current sense region 122. The current sense electrode 110 is disposed between the source electrode pad 111 and the current sense electrode pad 112. The current sense electrode 110 is a front surface electrode shared among all current sense cells. The source electrode pad 111 is provided in substantially the whole surface of the active region 121. The source electrode pad 111 is opposed to a part of the current sense electrode 110, a part of the current sense electrode pad 112 and a part of the gate electrode pad 113. The source electrode pad 111 is a front surface electrode (source electrode) shared among all active cells.

The current sense electrode pad 112 and the gate electrode pad 113 are disposed in the active region 121 so as to extend near the boundary with the termination structure portion 123 and along an inner circumference of the termination structure portion 123. The current sense electrode pad 112 is disposed more closely to the outer circumferential portion of the chip than the current sense electrode 110, and opposed to the current sense electrode 110. The current sense electrode 110 is electrically connected to the current sense electrode pad 112. Gate electrodes of the respective active cells are connected to the gate electrode pad 113 through not-shown gate runners. The termination structure portion 123 is a region in which an electric field on the front surface side of an $n^-$ type drift layer made of the semiconductor substrate is relaxed to retain a breakdown voltage.

As shown in FIG. 11, on the front surface side of the semiconductor substrate serving as the $n^-$ type drift layer 101, a plurality of cells having the same cell structure are provided to extend from the active region 121 to the current sense region 122. That is, the current sense cells having the same cell structure as the active cells disposed in the active region 121 are provided in the current sense region 122 continuously to the active cells. Each of these cells is provided with a general trench gate structure. The trench gate structure includes a p-type base region 102, a trench 103, a gate insulating film 104, a gate electrode 105, an $n^+$ type source region 106 and a $p^+$ type contact region 107. Inside the trench 103, the gate insulating film 104 is disposed along an inner wall of the trench 103 and the gate electrode 105 is embedded.

A front surface electrode (source electrode) also serving as the source electrode pad 111 makes contact with the $n^+$ type source regions 106 and the $p^+$ type contact regions 107 of the active cells. The current sense electrode 110 serving as a front surface electrode makes contact with the $n^+$ type source regions 106 and the $p^+$ type contact regions 107 of the current sense cells. The current sense electrode 110 and the source electrode pad 111 are electrically insulated from the gate electrodes 105 by an interlayer insulating film 109. The symbol 108 designates a high temperature oxide (HTO) film. An $n^+$ type drain layer and a drain electrode which are not shown are provided on a back surface side of the semiconductor substrate. The symbol w101 designates a width of a mesa region between adjacent trenches 103. The symbol w102 is a trench pitch.

The structure of another example of the background-art semiconductor device (hereinafter referred to as Background-Art Example 2) having a current sense element which is provided on the same semiconductor substrate as a main element is disposed will be described. FIG. 12 is a plan view showing a planar layout of the other example of the background-art semiconductor device. FIGS. 13A and 13B are sectional views showing sectional structures in a cutting plane line BB-BB' and a cutting plane line CC-CC' of FIG. 12 respectively. The sectional structure in the cutting plane line BB-BB' is shown in FIG. 13A. The sectional structure in the cutting plane line CC-CC' is shown in FIG. 13B. Background-Art Example 2 is different from Background-Art Example 1 (see FIG. 10 and FIG. 11) in the point that a current sense region 124 is disposed immediately under (on a drain side of) a current sense electrode pad 114. That is, the current sense electrode pad 114 also serves as a current sense electrode on a front surface of a semiconductor substrate.

Generally, the current sense region 124 has a structure to be surrounded by a diode region 125. That is, the diode region 125 is disposed between an active region 121 and the current sense region 124. A boundary between the active region 121 and the diode region 125 is not shown. The current sense electrode pad 114 is provided to extend from the current sense region 124 to the diode region 125 so that the current sense electrode pad 114 can not only entirely cover the substrate front surface in the current sense region 124 but also cover the substrate front surface in the diode region 125. Diode cells are disposed in the diode region 125. Each of the diode cells has a p-type base region 102 as an anode, and an n$^-$ type drift layer 101 and an n$^+$ type drain layer (not shown) as a cathode. The current sense electrode pad 114 also serves as an anode electrode. A drain electrode (not shown) also serves as a cathode electrode.

In the Background-Art Example 1 (see FIG. 10 and FIG. 11), a part of the cells of the active region 121 are used as current sense cells of the current sense region 122. Therefore, the source electrode pad 111 and the current sense electrode 110 have to be separated from each other. Accordingly, it is difficult to separate the electrodes in the recent microminiaturized cells. In addition, it is also necessary to reduce the thickness of each electrode in order to microminiaturize the cells. However, when the thickness of the electrode within the active region 121 is reduced, ON-resistance increases or reliability during fabrication deteriorates. Accordingly, the Background-Art Example 1 can be applied only to a cell structure large in cell pitch. In order to apply the Background-Art Example 1 to a microminiaturized cell structure, it is necessary to add a multistage metal step to form the cell structure into a multistage metal structure. The multistage metal step means a step of laminating a plurality of metal films of different metal materials, thereby resulting in the increase of the number of steps. Further, in the Background-Art Example 1, the current sense cells are disposed continuously to the active cells. Therefore, the Background-Art Example 1 has a problem that a current flows into the current sense cells from the active region 121 to cause deterioration of current sense accuracy.

In the Background-Art Example 2 (see FIG. 12 and FIGS. 13A and 13B), the diode region 125 is disposed between the active region 121 and the current sense region 124. Accordingly, it is possible to suppress a current from flowing into the current sense region 125 from the active region 121. However, current density in an ON time is usually increased in a trench gate type MOS semiconductor device. Therefore, in order to improve ruggedness to avalanche breakdown, surge, etc., the breakdown voltage of the active region 121 having a large occupation area relative to the surface area of the semiconductor substrate is lowered and a current is shared equally among the active cells. Since each current sense cell has the same cell structure as each active cell, the breakdown voltage of the current sense region 124 becomes as low as the breakdown voltage of the active region 121.

In addition, since the active cell and the current sense cell have the same cell structure, avalanche breakdown occurs in the active region 121 and the current sense region 124 simultaneously. On this occasion, since a range including the current sense region 124 and a part of the diode region 125 is covered with the current sense electrode pad 114, avalanche breakdown occurs in pn junction faces between the p-type base regions 102 and the n$^-$ type drift layer 101 in the current sense region 124 and the diode region 125. Therefore, a current increasing suddenly due to the avalanche breakdown (hereinafter referred to as avalanche current) flows into the current sense region 124 not only from the current sense region 124 but also from the diode region 125.

Normally, in comparison with the surface area of the semiconductor substrate, the area occupied by the current sense region 124 is small but the area occupied by the diode region 125 surrounding the current sense region 124 is large. Therefore, a larger avalanche current flows into the current sense cells disposed in the current sense region 124 than into the ordinary active cells correspondingly to the avalanche current flowing from the diode region 125. Thus, ruggedness to avalanche breakdown of the current sense region 124 becomes lower than ruggedness of the active region. Accordingly, it is necessary to protect the current sense element from avalanche breakdown, surge, etc. in order to suppress the ruggedness of the current sense region 124 from decreasing.

Generally in the background art, a resistor is connected to the current sense element (hereinafter referred to as first background-art structure) or a protection circuit such as a resistor, a Zener diode, etc. is provided in a control circuit (not shown) connected to the current sense element (hereinafter referred to as second background-art structure), in order to suppress the ruggedness of the current sense region from decreasing. In the first background-art structure, a current generated due to surge etc. is suppressed from flowing into the current sense element. In the second background-art structure, since the control circuit is protected from surge etc., ruggedness of the current sense element is improved. However, as protection applied to the current sense element is reinforced more greatly, it is more difficult for a current to flow into the current sense element, resulting in the decrease of the current flowing into the current sense element or the increase of the current flowing into the current sense element due to a parasitic effect of the element or the circuit. Therefore, there is a fear that current sense accuracy may deteriorate.

The following device has been proposed as a device in which current sense accuracy is improved. The device is a trench gate type semiconductor device in which all detector cells, active cells and inactive cells are provided with dummy gate electrodes. A dummy gate electrode is disposed on the bottom of each trench through an insulating film and a gate electrode is formed on the dummy gate electrode through an insulating film. The depth of the trench is increased correspondingly to the dummy gate electrode provided on the bottom side of the trench (e.g. see JP-A-2009-182113, paragraphs [0102] and [0103], and FIG. 19)).

In JP-A-2009-182113, the dummy gate electrode is provided or the trench is formed deeply. In this manner, a current flowing into each current sense cell (detector cell) from a region surrounding the current sense cell is suppressed and fluctuation of a current sense ratio is suppressed so that current sense accuracy can be improved.

The following device has been proposed as a device in which a current sense element is prevented from being broken down. A current detecting resistor is connected between a source electrode of a main element and a current sensing electrode of a current detecting element. A dielectric breakdown voltage of a gate insulating film is larger than the product of a maximum current which can flow into the current detecting element when a reverse bias voltage is applied and resistance of the resistor (e.g. see JP-A-2012-253391, paragraphs [0047] and [0048], and FIGS. 3 and 4)). In JP-A-2012-253391, a trench of each active cell (main element) is made deeper than a trench of each current sense cell (current detecting element) or a pitch between adjacent ones of the trenches of the active cells is made wider than a pitch between adjacent ones of the trenches of the current sense cells. Thus, the breakdown voltage of each current sense cell is made higher than the breakdown voltage of each active cell when a reverse bias voltage is applied.

However, in the first or second background-art structure, the number of steps increases because the protection unit against avalanche breakdown, surge, etc. is provided. Cost increases because it is necessary to secure an area for forming the protection unit on the same semiconductor substrate as the current sense element is disposed. In addition, in the first or second background-art structure, there is a fear that the current sense accuracy may deteriorate as protection applied to the current sense element is reinforced, as described above. In JP-A-2009-182113, since the dummy gate electrodes are provided or the trenches are formed deeply, the breakdown voltage of the current sense region decreases so that the ruggedness tends to decrease.

In order to solve the foregoing problems inherent in the background-art techniques, an object of the invention is to provide a semiconductor device in which current sense accuracy can be maintained while ruggedness of a current sense region can be improved.

SUMMARY OF THE INVENTION

In order to solve the foregoing problems and achieve the object of the invention, the semiconductor device according to the invention is a semiconductor device including a main element and a current detecting element, which are provided on the same semiconductor substrate (side-by-side), the main element having a first trench gate structure, the current detecting element having a second trench gate structure and detecting a current flowing into the semiconductor substrate when the main element is operating. The semiconductor device has the following characteristics. The first trench gate structure is provided with a first trench, a gate insulating film, and a gate electrode, the first trench being disposed on a first main surface side of the semiconductor substrate, the gate insulating film being disposed along an inner wall of the first trench, the gate electrode being disposed inside the first trench. The second trench gate structure is provided with a second trench, the gate insulating film, and the gate electrode, the second trench being disposed on the first main surface side of the semiconductor substrate, the gate insulating film being disposed along an inner wall of the second trench, the gate electrode being disposed inside the second trench. The second trench constituting the second trench gate structure of the current detecting element is narrower in width than the first trench constituting the first trench gate structure of the main element.

In order to solve the foregoing problems and achieve the object of the invention, the semiconductor device according to the invention is a semiconductor device including a main element and a current detecting element, which are provided on the same semiconductor substrate (side-by-side), the main element having a first trench gate structure, the current detecting element having a second trench gate structure and detecting a current flowing into the semiconductor substrate when the main element is operating. The semiconductor device has the following characteristics. The first trench gate structure is provided with a first trench, a gate insulating film, and a gate electrode, the first trench being disposed on a first main surface side of the semiconductor substrate, the gate insulating film being disposed along an inner wall of the first trench, the gate electrode being disposed inside the first trench. The second trench gate structure is provided with a second trench, the gate insulating film, and the gate electrode, the second trench being disposed on the first main surface side of the semiconductor substrate, the gate insulating film being disposed along an inner wall of the second trench, the gate electrode being disposed inside the second trench. Of the gate insulating film provided along the inner wall of the second trench constituting the second trench gate structure of the current detecting element, a portion provided in the bottom of the second trench is thicker in thickness than a portion provided in the bottom of the first trench, of the gate insulating film provided along the inner wall of the first trench constituting the first trench gate structure of the main element.

In addition, according to the invention, there is provided a semiconductor device in the aforementioned configuration, wherein the second trench is narrower in width than the first trench.

In addition, according to the invention, there is provided a semiconductor device in the aforementioned configuration, wherein the main element includes a plurality of first cells so that the first trench is interposed between adjacent ones of the first cells; the current detecting element includes a plurality of second cells so that the second trench is interposed between adjacent ones of the second cells; and each of the second cells is narrower in width than each of the first cells.

In addition, according to the invention, there is provided a semiconductor device in the aforementioned configuration, wherein the second trench is shallower in depth than the first trench.

In addition, according to the invention, there is provided a semiconductor device in the aforementioned configuration, further including: an active region, a current detecting region and a diode region, which are provided on the semiconductor substrate, the main element being disposed in the active region, the current detecting element being disposed in the current detecting region, the diode region surrounding the current detecting region; wherein: a diode which is connected in anti-parallel with the current detecting element is disposed in the diode region.

In addition, according to the invention, there is provided a semiconductor device in the aforementioned configuration, wherein breakdown voltage of the diode is higher than breakdown voltage of the main element but lower than breakdown voltage of the current detecting element.

In addition, according to the invention, there is provided a semiconductor device in the aforementioned configuration, wherein the gate insulating film is formed as an oxide film.

In addition, according to the invention, there is provided a semiconductor device in the aforementioned configuration, wherein the gate electrode is formed as a polysilicon layer.

According to the semiconductor device according to the invention, it is possible to make breakdown voltage of a current sense region (current detecting region) higher than breakdown voltage of an active region without providing any protection unit against avalanche breakdown, surge, etc. Thus, it is possible to obtain an effect that current sense accuracy can be maintained while ruggedness of the current sense region can be improved.

BRIEF DESCRIPTION OF THE DRAWINGS

FIG. 7B is a sectional view showing another state in which the semiconductor device according to Embodiment 5 is being manufactured;

DETAILED DESCRIPTION OF THE INVENTION

Preferred embodiments of a semiconductor device according to the invention will be described below in detail with reference to the accompanying drawings. In the description of the invention and the accompanying drawings, a layer or region prefixed with n or p means that electrons or holes are majority carriers in that layer or region. In addition, layers or regions designated by n or p suffixed with $^+$ and $^-$ mean a higher impurity concentration and a lower impurity concentration than layers or regions designated by n or p suffixed without $^+$ and $^-$. Incidentally, in the following description of the embodiments and the accompanying drawings, similar constituents will be referred to by the same symbols respectively and correspondingly and duplicate description thereof will be omitted.

Embodiment 1

Figure 1:
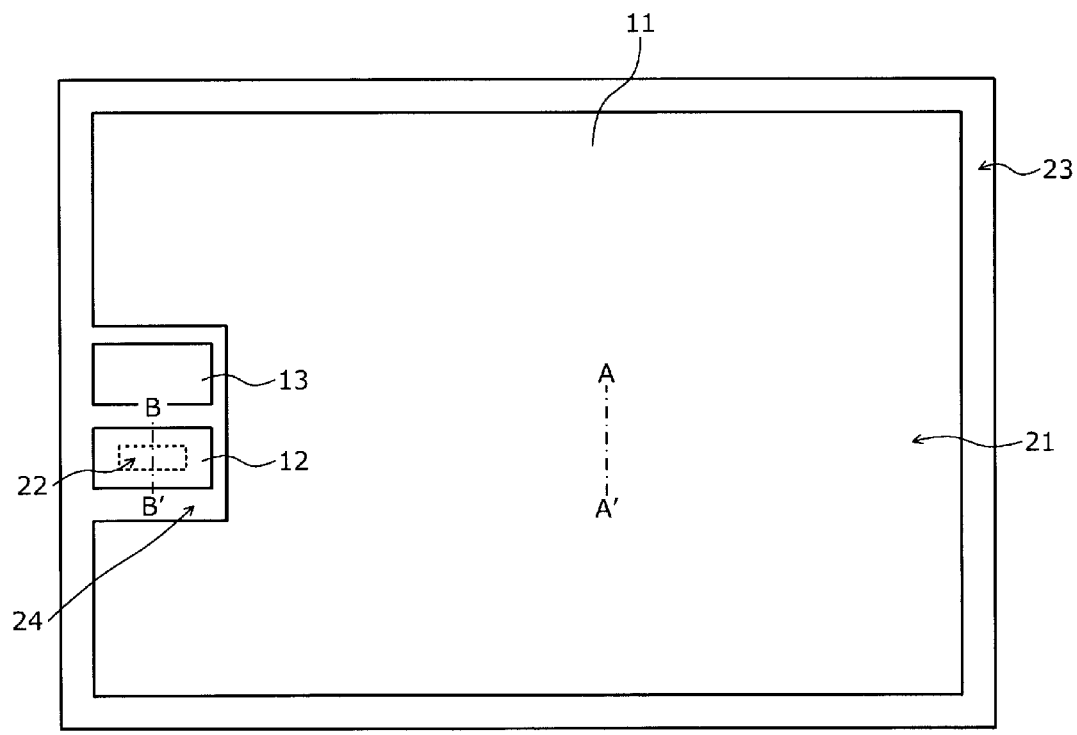
FIG. 1 is a plan view showing a planar layout of a semiconductor device according to Embodiment 1.
Figure 2A:
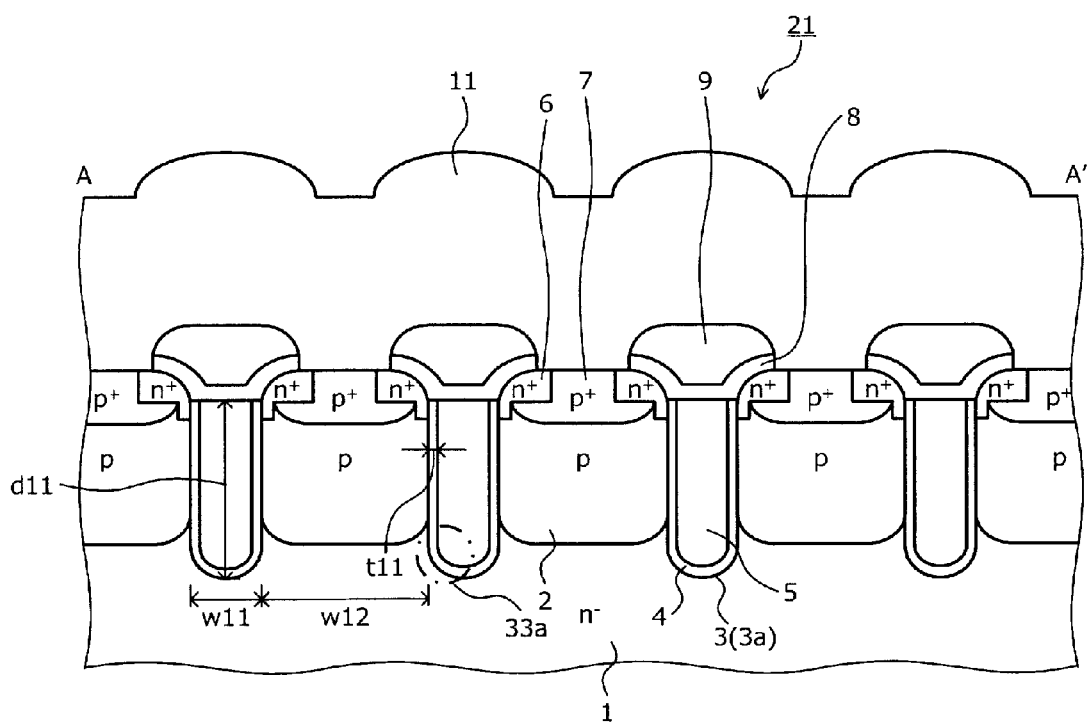
FIG. 2A is a sectional view showing sectional structures in a cutting plane line A-A'.
Figure 2B:
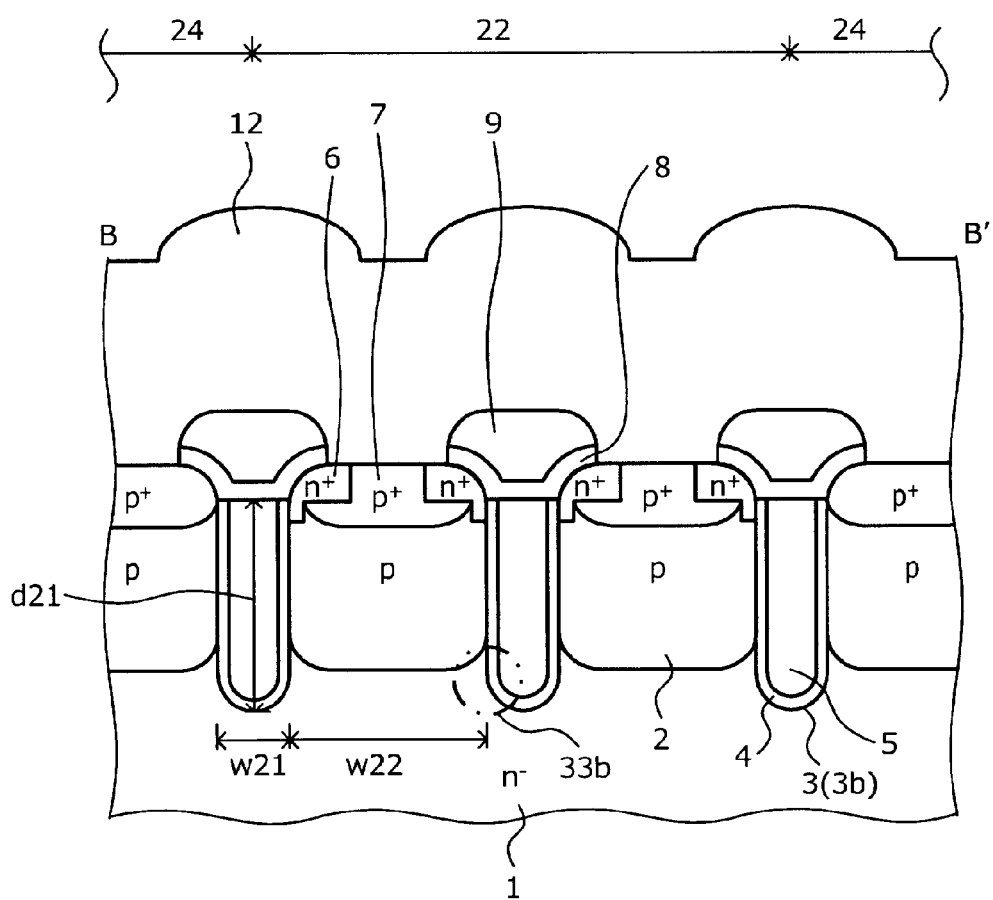
FIG. 2B is a sectional view showing sectional structures in a cutting plane line B-B' of FIG. 1.

As to the structure of a semiconductor device according to Embodiment 1, an MOSFET provided with trench gate structures each extending in a stripe shape in a horizontal direction (hereinafter referred to as first direction (direction perpendicular to a cutting plane line A-A' and a cutting plane line B-B')) to a substrate front surface will be described by way of example. FIG. 1 is a plan view showing a planar layout of the semiconductor device according to Embodiment 1. FIGS. 2A and 2B are sectional views showing sectional structures in the cutting plane line A-A' and the cutting plane line B-B' of FIG. 1 respectively. A planar layout of an active region 21, a current sense region 22 and respective electrode pads is shown in FIG. 1. The sectional structure in the cutting plane line A-A' along which trenches 3 are cut in a second direction perpendicular to the first direction in the active region 21 is shown in FIG. 2A. The sectional structure in the cutting plane line B-B' along which trenches 3 are cut in the second direction in the current sense region 22 is shown in FIG. 2B.

As shown in FIG. 1, in the semiconductor device according to Embodiment 1, a semiconductor element (current sense element (current detecting element)) for detecting a current flowing into a main element is provided on the same semiconductor substrate (semiconductor chip) as the main element is disposed. That is, the current sense element detects the current flowing into the semiconductor substrate where the main element is disposed. Specifically, the active region 21, the current sense region 22, a termination structure portion 23, and a diode region 24 are provided on the same semiconductor substrate. The active region 21 is provided in a center portion of the chip and its vicinity. The active region 21 occupies a major part of a surface area of the substrate front surface. A plurality of cells (active cells (second cells): not shown) constituting the main element are disposed in the active region 21. The current sense region 22 is disposed between the active region 21 and the termination structure portion 23. A plurality of cells (current sense cells (first cells): not shown) constituting the current sense element are disposed in the current sense region 22.

The diode region 24 surrounds the current sense region 22. That is, the diode region 24 is disposed between the active region 21 and the current sense region 22. A plurality of cells (hereinafter referred to as diode cells) constituting a cell structure of a diode are disposed in the diode region 24. The diode cells are connected in anti-parallel with the current sense cells. When the current sense cells are biased forward, the diode cells are biased reversely. That is, the diode cells are cells not operating when the current sense cells are operating. The diode cells have a function of suppressing the current from flowing into the current sense region 22 from the active region 21. Breakdown voltage of each diode cell is higher than breakdown voltage of each active cell but lower than breakdown voltage of each current sense cell. The termination structure portion 23 surrounds the active region 21. A boundary between the active region 21 and the current sense region 22, a boundary between the active region 21 and the diode region 24, and a boundary between the active region 21 and the termination structure portion 23 are not shown.

In the active region 21, a source electrode pad 11 and a gate electrode pad 13 are provided separately from each other on the front surface of the semiconductor substrate. The source electrode pad 11 is provided in substantially the whole surface of the active region 21. Specifically, the source electrode pad 11 is disposed, for example, to surround three sides of a substantially rectangular region of the front surface of the semiconductor substrate. In the substantially rectangular region, a current sense electrode pad 12 and the gate electrode pad 13 are provided. The source electrode pad 11 is opposed to a part of the current sense electrode pad 12 and a part of the gate electrode pad 13. The source electrode pad 11 is a front surface electrode (source electrode) shared among all the active cells. The gate electrode pad 13 is disposed in the vicinity of the boundary between the active region 21 and the termination structure portion 23. Gate electrodes of the respective active cells are connected to the gate electrode pad 13 through not-shown gate runners.

In the current sense region 22, the current sense electrode pad 12 is provided on the front surface of the semiconductor substrate and separately from the source electrode pad 11 and the gate electrode pad 13. The current sense electrode pad 12 is provided to extend from the current sense region 22 to the diode region 24 so that the current sense electrode pad 12 can cover the whole substrate front surface in the current sense region 22 and cover the substrate front surface in the diode region 24. In addition, the current sense electrode pad 12 is disposed on an inner side than the termination structure portion 23 and side by side with the gate electrode pad 13 along an inner circumference of the termination structure portion 23. The current sense electrode pad 12 also serves as a front surface electrode (current sense electrode) shared among all the current sense cells. For example, a breakdown voltage structure (not shown) consisting of a guard ring, a field plate, a RESURF (Reduced Surface Field) or a combination of these is provided in the termination structure portion 23.

As shown in FIGS. 2A and 2B, a plurality of cells are provided on the front surface side of the semiconductor substrate (semiconductor chip) to extend from the active region 21 to the current sense region 22. The semiconductor substrate serves as an $n^-$ type drift layer 1. The active cells (cells disposed in the active region 21) and the current sense cells (cells disposed in the current sense region 22) have trench gate structures (first and second trench gate structures). Each trench gate structure includes a p-type base region 2, a trench 3, a gate insulating film 4, a gate electrode 5, $n^+$ type source regions 6, and a $p^+$ type contact region 7. The cells (diode cells) in each of which the p-type base region 2 is used as an anode, the $n^-$ type drift layer 1 and an $n^+$ type drain layer (not shown) which will be described below are used as a cathode are disposed in the diode region 24. Inside each of the trenches 3, the gate insulating film 4 is disposed along an inner wall of the trench 3 and the gate electrode 5 is embedded. Incidentally, the gate insulating film 4 may be formed as an oxide film and the gate electrode 5 may be formed as a polysilicon layer.

Specifically, the p-type base regions 2 are provided in a front layer of the front surface of the semiconductor substrate to extend from the active region 21 to the current sense region 22. Each of the trenches 3 ($3a$ and $3b$) which penetrates the p-type base region 2 in a depth direction and reaches the $n^-$ type drift layer 1 is provided. For example, each of the trenches 3 has a planar layout shaped like a stripe extending in the first direction. The trenches 3 are disposed to extend from the active region 21 to the current sense region 22. One cell (element's functional unit) is constituted by a portion (mesa region) interposed between adjacent ones of the trenches 3 in each of the active region 21, the current sense region 22 and the diode region 24.

A second-direction width w22 of each mesa region (mesa width of each current sense cell) between adjacent trenches (second trenches) $3b$ in the current sense region 22 is equal to a second-direction width w12 of each mesa region (mesa width of each active cell) between adjacent trenches (first trenches) $3a$ in the active region 21 (w22=w12). A second-direction (direction in which the trenches 3 are arranged side by side) width (hereinafter simply referred to as width) w21 of each trench $3b$ in the current sense region 22 is narrower than a width w11 of each trench $3a$ in the active region 21 (w21<w11). A depth d21 of each trench $3b$ in the current sense region 22 may be equal to a depth d11 of each trench $3a$ in the active region 21 (d21=d11) or may be shallower than a depth d11 of each trench $3a$ in the active region 21 (d21<d11).

When the depth d21 of the trench $3b$ in the current sense region 22 is equal to the depth d11 of the trench $3a$ in the active region 21, for example, the trench $3a$ in the active region 21 and the trench $3b$ in the current sense region 22 may be formed by different etching steps. On the other hand, when the depth d21 of the trench $3b$ in the current sense region 22 is shallower than the depth d11 of the trench $3a$ in the active region 21, for example, the trench $3a$ in the active region 21 and the trench $3b$ in the current sense region 22 may be formed by the same etching step. It is because that the depth of the trench can be made shallower as the width of the trench is narrower. The case where the depth d21 of the trench $3b$ in the current sense region 22 is made shallower than the depth d11 of the trench $3a$ in the active region 21 will be described in Embodiment 6 which will be described later.

It is preferable that the curvature of a bottom corner portion $33b$ of the trench $3b$ in the current sense region 22 is made as small as possible. The reason is as follows. Generally, as the curvature of the bottom corner portion of the trench is smaller, the curve state of the bottom corner portion is gentler. Therefore, current concentration in the bottom corner portion can be suppressed. In this case, the breakdown voltage of the cell can be improved as the width of the trench is made narrower. Therefore, assume that the curvature of the bottom corner portion $33b$ of the trench $3b$ in the current sense region 22 is, for example, substantially equal to the curvature of a bottom corner portion $33a$ of the trench $3a$ in the active region 21. In this case, the width w21 of the trench $3b$ in the current sense region 22 is narrower than the width w11 of the trench $3a$ in the active region 21, as described above. Therefore, the breakdown voltage of the current sense region 22 can be made higher than the breakdown voltage of the active region 21.

Inside the trench 3 ($3a$, $3b$), the gate insulating film 4 is provided along the inner wall of the trench 3 and the gate electrode 5 is provided on an inner side of the gate insulating film 4. In each mesa region between adjacent trenches 3 in each of the active region 21 and the current sense region 22, the $n^+$ type source regions 6 and the $p^+$ type contact region 7 are provided selectively inside the p-type base region 2. In each of the trenches 3 put adjacently to each other with the interposition of the mesa region, the n⁺ type source regions 6 are opposed to the gate electrode 5 through the gate insulating film 4 provided on the side wall of the trench 3. That is, trench gates as a whole (the gate insulating film 4 is disposed along the inner walls of the trenches 3 and the gate electrodes 5 are embedded inside the trenches 3) together with the active cells and the current sense cells operate as an MOSFET.

In addition, no n⁺ type source region 6 is provided in the diode region 24. Therefore, in the diode region 24, each p-type base region 2 functions as an anode region. Each p⁺ type contact region 7 is provided, for example, in the center of the mesa region and its vicinity and separately from the gate insulating film 4 provided on the side wall of the trench 3. The p⁺ type contact region 7 makes contact with the n⁺ type source regions 6 provided within the same mesa region in each of the active region 21 and the current sense region 22. The p⁺ type contact region 7 may not be provided in the diode region 24. A high temperature oxide (HTO) film 8 and an interlayer insulating film 9 are provided sequentially on the gate electrode 5 so as to cover the gate electrode 5.

In contact holes which penetrate the high temperature oxide film 8 and the interlayer insulating film 9 in the depth direction, the n⁺ type source regions 6 and the p⁺ type contact regions 7 are exposed in the active region 21 and the current sense region 22, and the p-type base regions 2 are exposed in the diode region 24. A front surface electrode (source electrode) also serving as the source electrode pad 11 and a front surface electrode (current sense electrode) also serving as the current sense electrode pad 12 are provided on the interlayer insulating film 9. The source electrode pad 11 makes contact with the n⁺ type source regions 6 and the p⁺ type contact regions 7 of the active cells through the contact holes of the active region 21.

The current sense electrode pad 12 makes contact with the n⁺ type source regions 6 and the p⁺ type contact regions 7 of the current sense cells through the contact holes of the current sense region 22. In addition, the current sense electrode pad 12 makes contact with the p-type base regions 2 of the diode cells through the contact holes of the diode region 24. The current sense electrode pad 12 functions as anode electrodes of the diode cells. The source electrode pad 11 and the current sense electrode pad 12 are electrically insulated from the gate electrodes 5 by the interlayer insulating film 9. An n⁺ type drain layer and a drain electrode which are not shown but are shared among the active cells and the current sense cells are provided all over a substrate back surface on a back surface side of the semiconductor substrate. The drain electrode also serves as cathode electrodes of the diode cells.

The aforementioned semiconductor device according to Embodiment 1 can be produced (manufactured), for example, by general MOSFET manufacturing steps. On this occasion, portions where the mesa widths w12 and w22 of the cells and the widths w11 and w21 of the trenches 3a and 3b are different can be formed by use of the same mask having openings in a predetermined pattern. Therefore, no additional step is required. In addition, when the n⁺ type source regions 6 are formed in the active region 21 and the current sense region 22 in the condition that the diode region 24 is covered with a mask for forming the n⁺ type source regions 6, the p-type base regions 2 functioning as anode regions can be formed. In addition, in the case where a trench pitch (interval at which the trenches 3 are arranged) is made narrow and the mesa widths w12 and w22 of the cells are made fine, the number of steps is increased.

However, a multistage metal step for laminating a plurality of metal films of different metal materials may be added. In the semiconductor device according to Embodiment 1, the current sense region 22 is disposed inside the current sense electrode pad 12 separated from the active region 21. Accordingly, even for the microminiaturized cell structure, it is not necessary to use the multistage metal structure.

As described above, according to Embodiment 1, when the width of the trench is made narrow, a depletion layer can spread easily. Accordingly, when the width of the trench in the current sense region is made narrower than the width of the trench in the active region, the depletion layer in the current sense region spreads more widely than the depletion layer in the active region. In this manner, since current concentration in the current sense region due to avalanche breakdown, surge, etc. can be suppressed more greatly than current concentration in the active region due to avalanche breakdown, surge, etc., the breakdown voltage of the current sense region can be made higher than the breakdown voltage of the active region. Since avalanche breakdown etc. occurs more easily in the active region than in the current sense region, ruggedness of the current sense region can be improved. Accordingly, the current sense region can be protected from avalanche breakdown, surge, etc. In addition, according to Embodiment 1, since it is not necessary to provide a protection unit against avalanche breakdown, surge, etc. as in the first or second background-art structure, it is possible to prevent current sense accuracy from deteriorating. Thus, it is possible to maintain the current sense accuracy and it is possible to improve the ruggedness of the current sense region. In addition, according to Embodiment 1, since it is not necessary to provide a protection unit against avalanche breakdown, surge, etc. as in the first or second background-art structure, it is possible to reduce the size without requiring any additional step for providing the protection unit against avalanche breakdown, surge, etc. Thus, it is possible to prevent the cost from increasing. In addition, according to Embodiment 1, since the trench gate structure is used, a bad influence of JFET (Junction FET) resistance can be avoided. Therefore, even if the width of the trench in the current sense region is made narrow, a current sense ratio (conversion ratio for calculating a current actually flowing into the active region based on a current detected by the current sense element) can be kept constant regardless of the magnitude of a current flowing into the semiconductor substrate. Accordingly, the current sense accuracy can be maintained.

Embodiment 2

Figure 3:
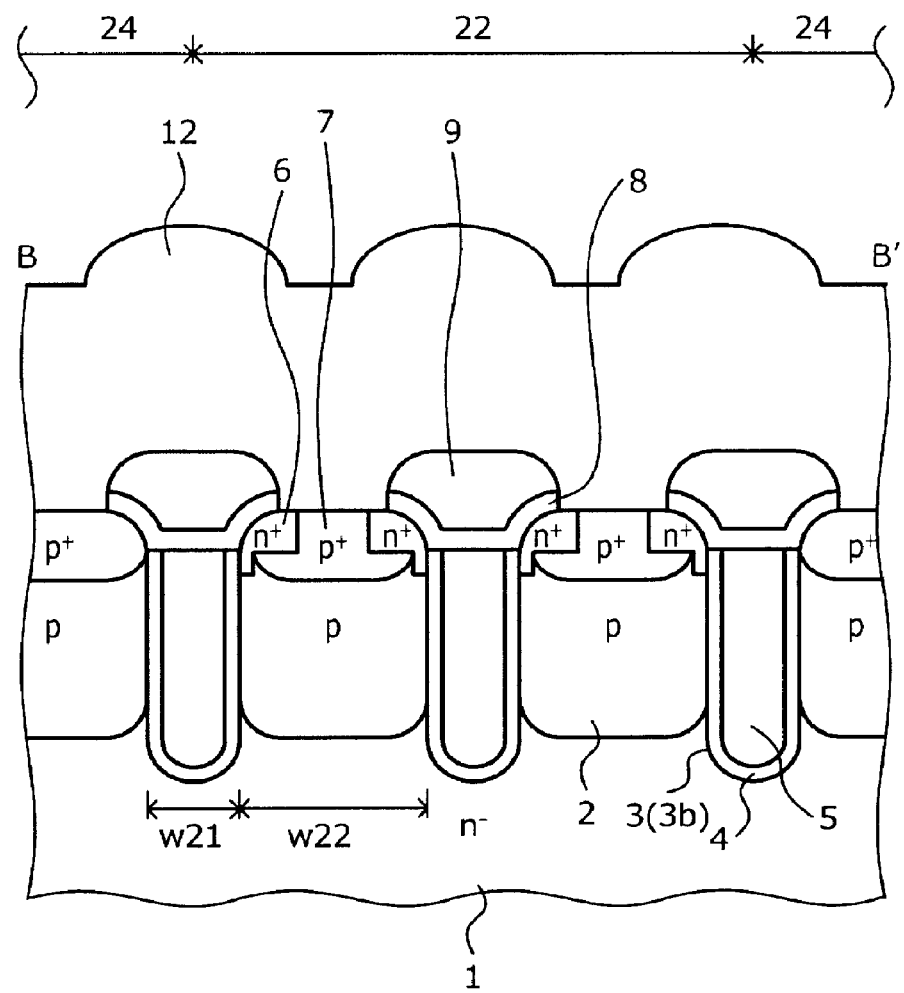
FIG. 3 is a sectional view showing a sectional structure in a current sense region of a semiconductor device according to Embodiment 2.

Next, the structure of a semiconductor device according to Embodiment 2 will be described. FIG. 3 is a sectional view showing a sectional structure in a current sense region of the semiconductor device according to Embodiment 2. A planar layout of the semiconductor device and a sectional structure of an active region 21 according to Embodiment 2 are the same as those according to Embodiment 1 (see FIG. 1 and FIG. 2A). The semiconductor device according to Embodiment 2 is different from the semiconductor device according to Embodiment 1 in the following two points. The first different point is that the width w21 of the trench 3b in the current sense region 22 and the width w11 of the trench 3a in the active region 21 are made equal to each other (w21=w11). The second different point is that the mesa width w22 of the current sense cell is made narrower than the mesa width w12 of the active cell (w22<w12). That is, configuration is made such that the current sense cells in the current sense region 22 are arranged at a narrower cell pitch than the active cells in the active region 21 and only the mesa width w12 of the cell in the active region 21 and the mesa width w22 of the cell in the current sense region 22 are different from each other.

As described above, according to Embodiment 2, configuration is made such that only the mesa widths of the cells are different between the active region and the current sense region. Accordingly, it is possible to make the breakdown voltage of the current sense region higher than the breakdown voltage of the active region. In this manner, it is possible to improve ruggedness of the current sense region in a similar manner to that according to Embodiment 1. In addition, according to Embodiment 2, it is not necessary to provide a protection unit against avalanche breakdown, surge, etc., so that it is possible to maintain current sense accuracy and prevent the cost from increasing in a similar manner to that according to Embodiment 1. In addition, according to Embodiment 2, the trench gate structure is used so that a bad influence of JFET resistance can be avoided. Therefore, even if the mesa width of the current sense cell is made narrow, the current sense ratio can be kept constant regardless of the magnitude of the current flowing into the semiconductor substrate. Accordingly, the current sense accuracy can be maintained in a similar manner to that according to Embodiment 1.

Embodiment 3

Next, the structure of a semiconductor device according to Embodiment 3 will be described. The semiconductor device according to Embodiment 3 is different from the semiconductor device according to Embodiment 1 in the point that the mesa width w22 of the current sense cell is made narrower than the mesa width w12 of the active cell (w22<w12). That is, the semiconductor device according to Embodiment 3 has a configuration in which the mesa width w22 of the current sense cell is made narrower than the mesa width w12 of the active cell and the width w21 of the trench 3b in the current sense region 22 is made narrower than the width w11 of the trench 3a in the active region 21 (w22<w12 and w21<w11).

As described above, according to Embodiment 3, it is possible to obtain a similar effect to that according to Embodiments 1 and 2. In addition, according to Embodiment 3, configuration is formed as a combination of Embodiments 1 and 2 so that it is possible to make the breakdown voltage of the current sense region further higher than the breakdown voltage of the active region.

Embodiment 4

Figure 4:
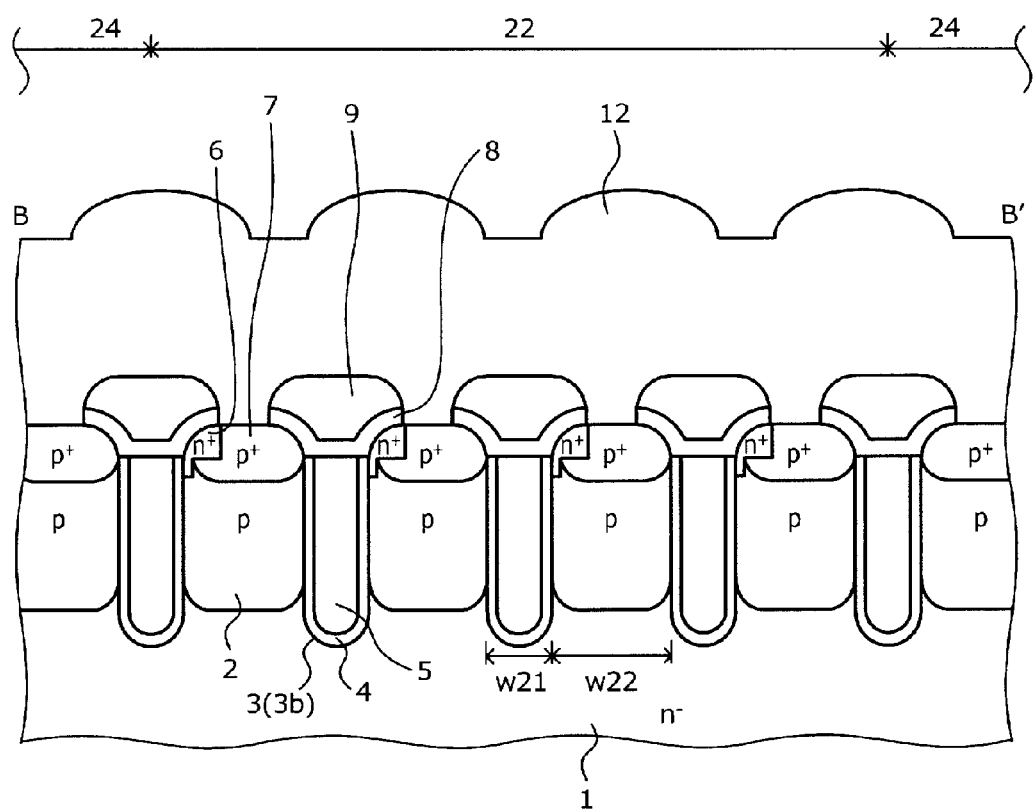
FIG. 4 is a sectional view showing a sectional structure in a current sense region of a semiconductor device according to Embodiment 4.

Next, the structure of a semiconductor device according to Embodiment 4 will be described. FIG. 4 is a sectional view showing a sectional structure in a current sense region of the semiconductor device according to Embodiment 4. A planar layout of the semiconductor device and a sectional structure of an active region 21 according to Embodiment 4 are the same as those according to Embodiment 1 (see FIG. 1 and FIG. 2A). The semiconductor device according to Embodiment 4 is different from the semiconductor device according to Embodiment 1 in the point that each $n^+$ type source region 6 is provided only on one trench 3b side of adjacent ones of trenches 3b between which each mesa region is interposed in the current sense region 22. That is, only one side of each current sense cell (one trench gate side of adjacent ones of trench gates between which each mesa region is interposed) operates as an MOSFET.

Embodiments 2 and 3 may be applied to Embodiment 4 so that Embodiment 4 can have a configuration in which the mesa width w22 of the current sense cell is made narrower than the width w12 of the active cell (w22<w12).

As described above, according to Embodiment 4, it is possible to obtain a similar effect to that according to Embodiment 1. In addition, according to Embodiment 4, since no $n^+$ type source region is provided on one trench side of adjacent ones of trenches between which each mesa region is interposed in the current sense region, the mesa width of the current sense cell can be made narrower. Specifically, it is possible to make the mesa width narrower by about 20% than that according to Embodiment 1. In this manner, it is possible to microminiaturize the current sense cell.

Embodiment 5

Figure 5:
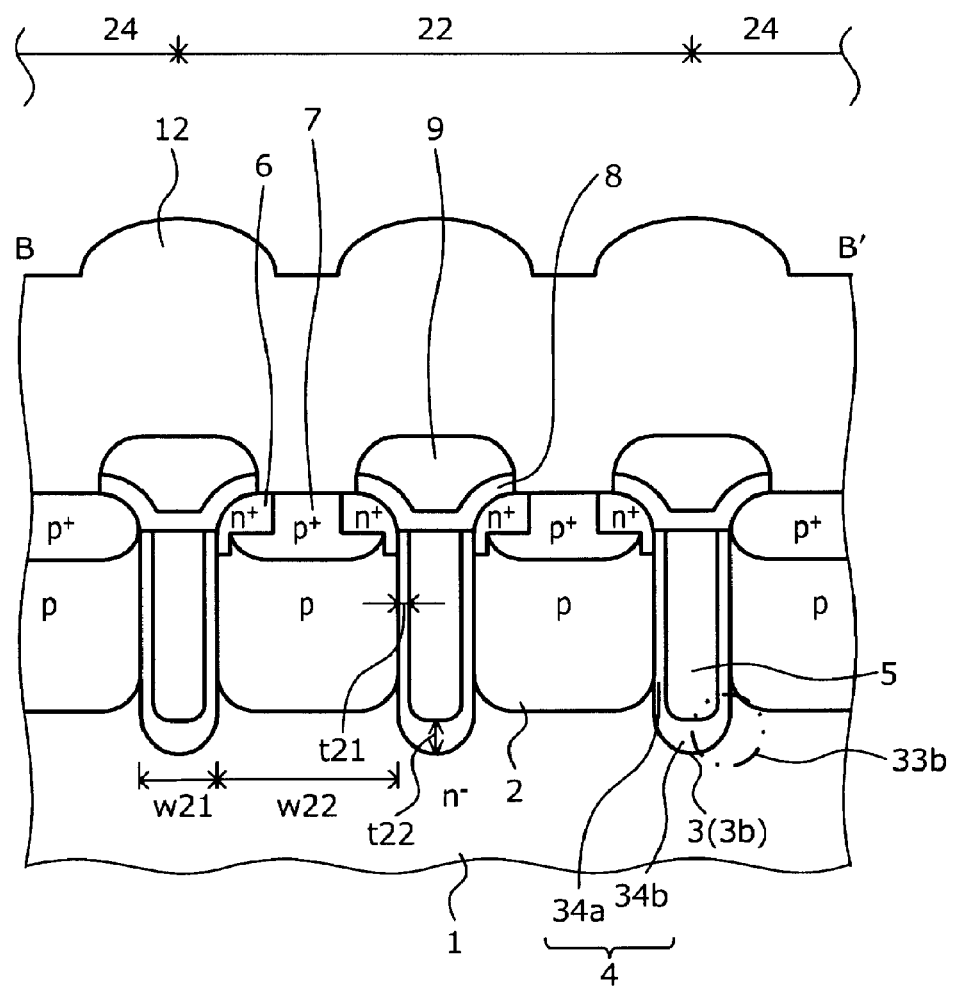
FIG. 5 is a sectional view showing a sectional structure in a current sense region of a semiconductor device according to Embodiment 5.

Next, the structure of a semiconductor device according to Embodiment 5 will be described. FIG. 5 is a sectional view showing a sectional structure in a current sense region of the semiconductor device according to Embodiment 5. A planar layout of the semiconductor device and a sectional structure of an active region 21 according to Embodiment 5 are the same as those according to Embodiment 1 (see FIG. 1 and FIG. 2A). The semiconductor device according to Embodiment 5 is different from the semiconductor device according to Embodiment 1 in the point that, of the gate insulating film 4 in the current sense region 22, a thickness t22 of a portion 34b which is provided in the bottom of each trench 3b is made thicker than a thickness (the symbol t11 in FIG. 2) of a portion which is provided in the bottom of each trench 3a, of the gate insulating film 4 in the active region 21 (t11<t22).

Specifically, the thickness t11 of the gate insulating film 4 in the active region 21 is substantially uniform in the range of from the side wall of the trench 3a to the bottom of the trench 3a. For example, of the gate insulating film 4 in the current sense region 22, a thickness t21 of a portion 34a which is provided in the side wall of the trench 3b is equal to the thickness t11 of the gate insulating film 4 in the active region 21. That is, of the gate insulating film 4 in the current sense region 22, the thickness t22 of the portion 34b which is provided in the bottom of the trench 3b is thicker than the thickness t21 of the portion 34a which is provided in the side wall of the trench 3b (t21<t22). In this manner, current concentration in the bottom corner portion 33b of the trench 3b in the current sense region 22 can be suppressed more greatly than current concentration in the bottom corner portion of the trench 3a in the active region 21.

Of the gate insulating film 4 in the current sense region 22, the thickness t21 of the portion 34a which is provided in the side wall of the trench 3b may be made equal to the thickness t22 of the portion 34b which is provided in the bottom of the trench 3b. In this case, of the gate insulating film 4 in the current sense region 22, the thickness t21 of the portion 34a which is provided in the side wall of the trench 3b is made thin enough to form a channel (n-type inversion layer) in a portion of the p-type base region 2 provided in the side wall of the trench 3b in an ON time. Of the gate insulating film 4 in the current sense region 22, the thickness t21 of the portion 34a which is provided in the side wall of the trench 3b may be preferably thin enough to maintain current capability or ON-resistance of the current sense cell in predetermined conditions.

Of the gate insulating film 4 in the current sense region 22, the thickness t22 of the portion 34b which is provided in the bottom of the trench 3b is preferably thicker by about 10% than, of the gate insulating film 4 in the active region 21, the thickness of the portion which is provided in the bottom of the trench 3a (that is, thickness t11 of the gate insulating film 4 in the active region 21) (t22=t11×1.1). Although not limited particularly, for example, assume that the thickness t11 of the gate insulating film 4 in the active region 21 is about 100 nm and, of the gate insulating film 4 in the current sense region 22, the thickness t22 of the portion 34b which is provided in the bottom of the trench 3b is about 110 nm. In this case, the breakdown voltage of the active region 21 can be set at about 66 V and the breakdown voltage of the current sense region 22 can be set at about a little less than 70 V.

Figure 6A:
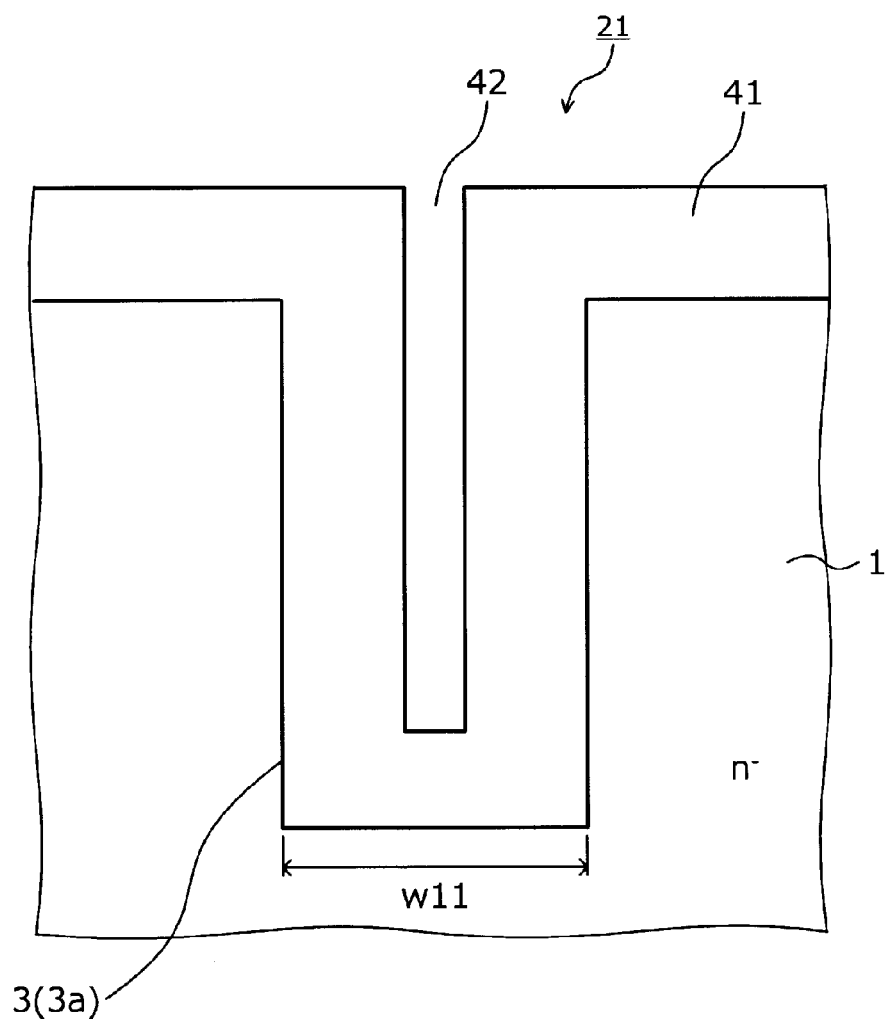
FIG. 6A is a sectional view showing a state in which the semiconductor device according to Embodiment 5 is being manufactured.
Figure 6B:
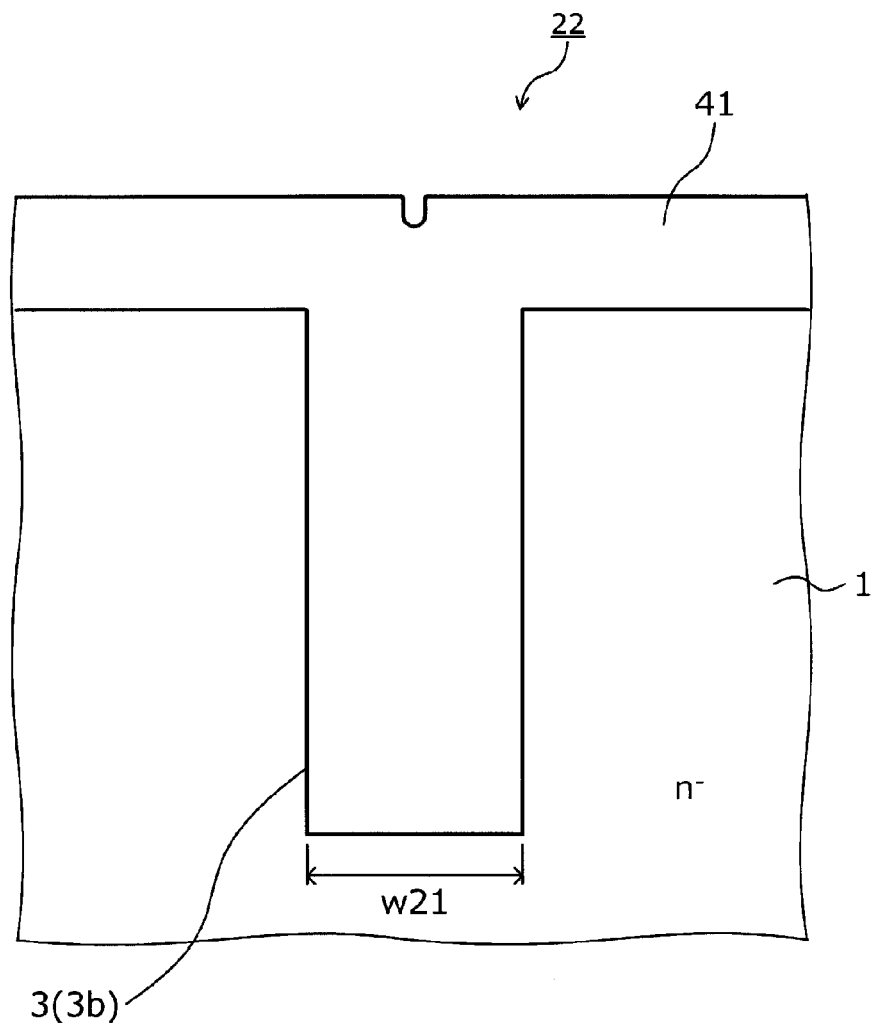
FIG. 6B is a sectional views showing another state in which the semiconductor device according to Embodiment 5 is being manufactured.
Figure 7A:
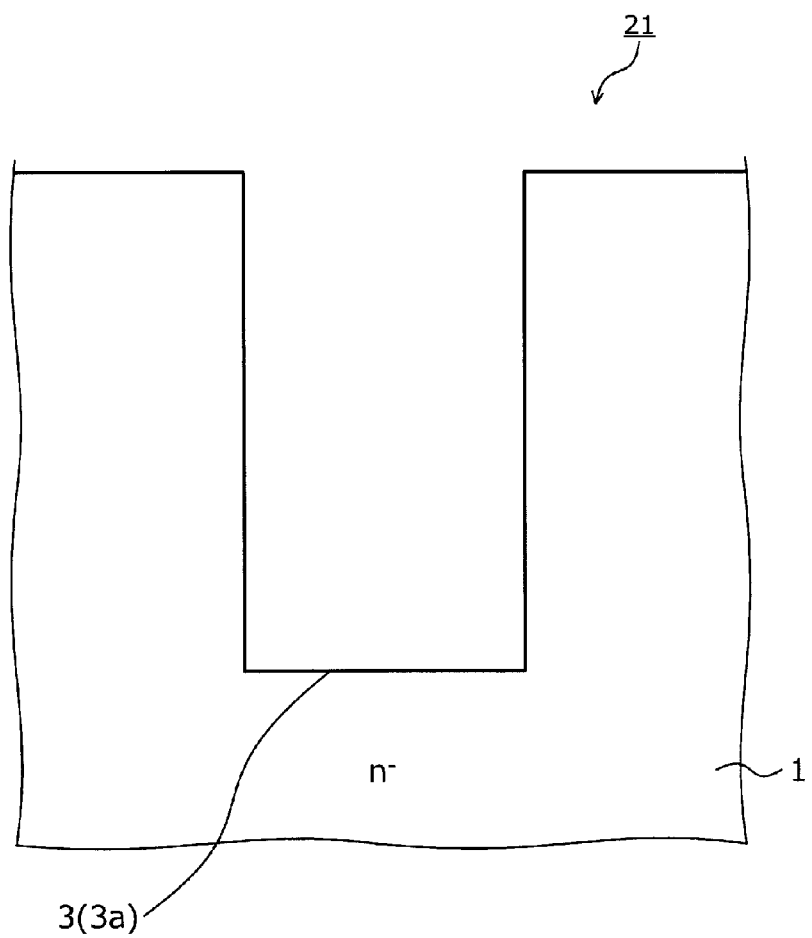
FIG. 7A is a sectional view showing a state in which the semiconductor device according to Embodiment 5 is being manufactured.
Figure 8A:
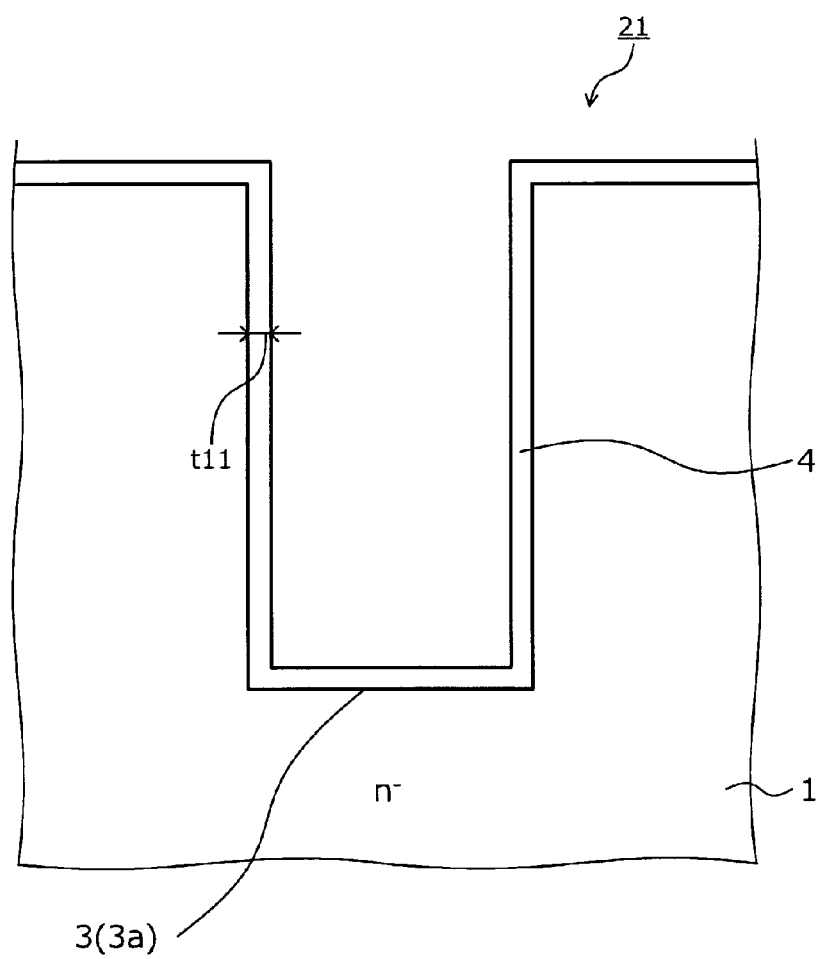
FIG. 8A is a sectional views showing a state in which the semiconductor device according to Embodiment 5 is being manufactured.
Figure 8B:
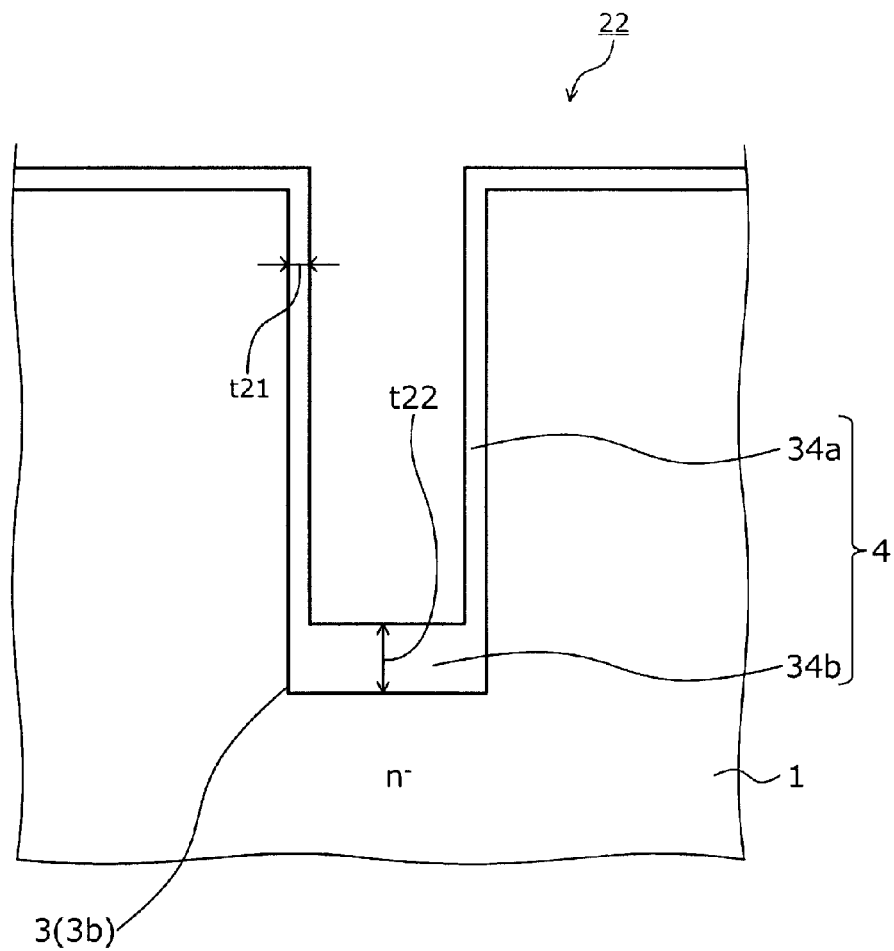
FIG. 8B is a sectional view showing another state in which the semiconductor device according to Embodiment 5 is being manufactured.

Next, a method for manufacturing the semiconductor device according to Embodiment 5 will be described. FIGS. 6A and 6B, FIGS. 7A and 7B, and FIGS. 8A and 8B are sectional views showing states in which the semiconductor device according to Embodiment 5 is being manufactured. FIGS. 6A, 7A and 8A show states of each trench 3a and its vicinity in the active region 21. FIGS. 6B, 7B and 8B show states of each trench 3b and its vicinity in the current sense region 22. The shapes of the trenches 3 are simplified in FIGS. 6A and 6B, FIGS. 7A and 7B, and FIGS. 8A and 8B. In fact, the bottom corner portion of each trench 3 however actually has a curved surface with a predetermined curvature in a similar manner to that in FIG. 5. Here, only the method for forming the gate insulating film 4 will be described. Description about the method for forming the other portions than the trenches 3 and the gate insulating film 4 of the MOSFET will be omitted.

First, as shown in FIGS. 6A and 6B, the trenches 3 (3a and 3b) are formed to have predetermined depths d11 and d21 from the front surface of the semiconductor substrate (semiconductor wafer) in a range of from the active region 21 to the current sense region 22 by a general method. The semiconductor substrate serves as the n⁻ type drift layer 1. On this occasion, the width w21 of the trench 3b in the current sense region 22 is made narrower than the width w11 of the trench 3a in the active region 21 (w21<w11). The trench 3a in the active region 21 and the trench 3b in the current sense region 22 may be formed by the same etching step or may be formed by different etching steps.

Next, an insulating film 41 is deposited on the front surface of the semiconductor substrate and inside the trenches 3a and 3b. The insulating film 41 is entirely embedded inside the trench 3b in the current sense region 22. The insulating film 41 may be formed by thermal oxidation. On this occasion, the width w21 of the trench 3b in the current sense region 22 is narrower than the width w11 of the trench 3a in the active region 21, as described above. Accordingly, the trench 3a in the active region 21 is not entirely filled with the insulating film 41. That is, inside the trench 3a in the active region 21, the insulating film 41 is deposited along the inner wall of the trench 3a and a gap 42 is formed inside the insulating film 41.

Next, as shown in FIGS. 7A and 7B, the insulating film 41 on the front surface of the substrate is removed by etchback, and the insulating film 41 stays behind with a predetermined thickness t22 inside the trench 3b in the current sense region 22. The insulating film 41 staying behind inside the trench 3b in the current sense region 22 after the etchback corresponds to the thick portion 34b provided in the bottom of the trench 3b, of the gate insulating film 4. In addition, since the trench 3a in the active region 21 is not completely filled with the insulating film 41 as described above, the insulating film 41 inside the trench 3a in the active region 21 can be entirely removed by etchback.

Next, as shown in FIGS. 8A and 8B, the front surface of the semiconductor substrate, the inner wall of the trench 3a in the active region 21 and the side walls of the trench 3b in the current sense region 22 are thermally oxidized so that the gate insulating film 4 can be formed with predetermined thicknesses t11 and t21 (t11=t21). The gate insulating film 4 formed on the side walls of the trench 3b in the current sense region 22 corresponds to thin portions 34a in the side walls of the trench 3b, of the gate insulating film 4. In this manner, the gate insulating film 4 is formed so that, inside the trench 3b in the current sense region 22, a thickness t22 of the portion 34b provided in the bottom of the trench 3b can be thicker than the thickness t21 of any other portion of the trench 3b (t21<t22).

In addition, since the insulating film 41 inside the trench 3a in the active region 21 is entirely removed by etchback, the gate insulating film 4 is formed with the uniform thickness t11 in a range of from the side walls of the trench 3a to the bottom of the trench 3a inside the trench 3a in the active region 21. Incidentally, although description will be omitted, all the other portions of the MOSFET than the trenches 3 and the gate insulating film 4 such as all the remaining portions of the MOS gate structure, front surface electrodes (respective electrode pads), a back surface element structure (an n⁺ type drain layer and a drain electrode) may be formed at predetermined timings by a general method. Then, the semiconductor wafer is cut (dicing) into chips. Thus, the MOSFET shown in FIG. 2A and FIG. 5 is completed.

The width w21 of the trench 3b in the current sense region 22 may be equal to the width w11 of the trench 3a in the active region 21. That is, configuration may be made such that only the thickness of the gate insulating film 4 is different between the active region 21 and the current sense region 22 (w21=w11 and w22=w12). In addition, Embodiments 2 and 3 may be applied to Embodiment 5 to have a configuration in which the mesa width w22 of the current sense cell is made narrower than the mesa width w12 of the active cell (w22<w12). When the width w21 of the trench 3b in the current sense region 22 is equal to the width w11 of the trench 3a in the active region 21 (w21=w11), a step of removing the insulating film 41 staying behind inside the trench 3a in the active region 21 may be added after etchback but before thermal oxidation in the aforementioned method for manufacturing the semiconductor device according to Embodiment 5. In addition, Embodiment 4 may be applied to Embodiment 5 to have a configuration in which only one side of each current sense cell operates as an MOSFET.

As described above, according to Embodiment 5, current concentration in the bottom corner portion of the trench in the current sense region can be suppressed more greatly than current concentration in the bottom corner portion of the trench in the active region. Accordingly, it is possible to make the breakdown voltage of the current sense region higher than the breakdown voltage of the active region so that it is possible to obtain a similar effect to that according to Embodiment 1.

Embodiment 6

Figure 9:
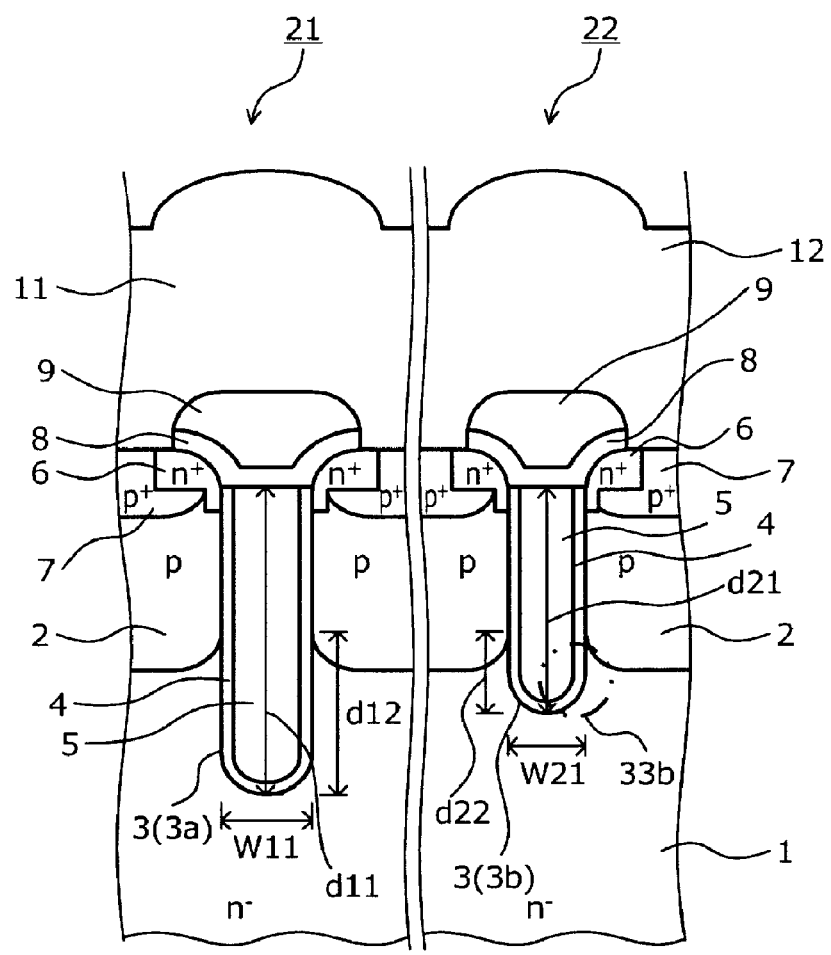
FIG. 9 is a sectional view showing a sectional structure in a current sense region of a semiconductor device according to Embodiment 6.
Figure 10:
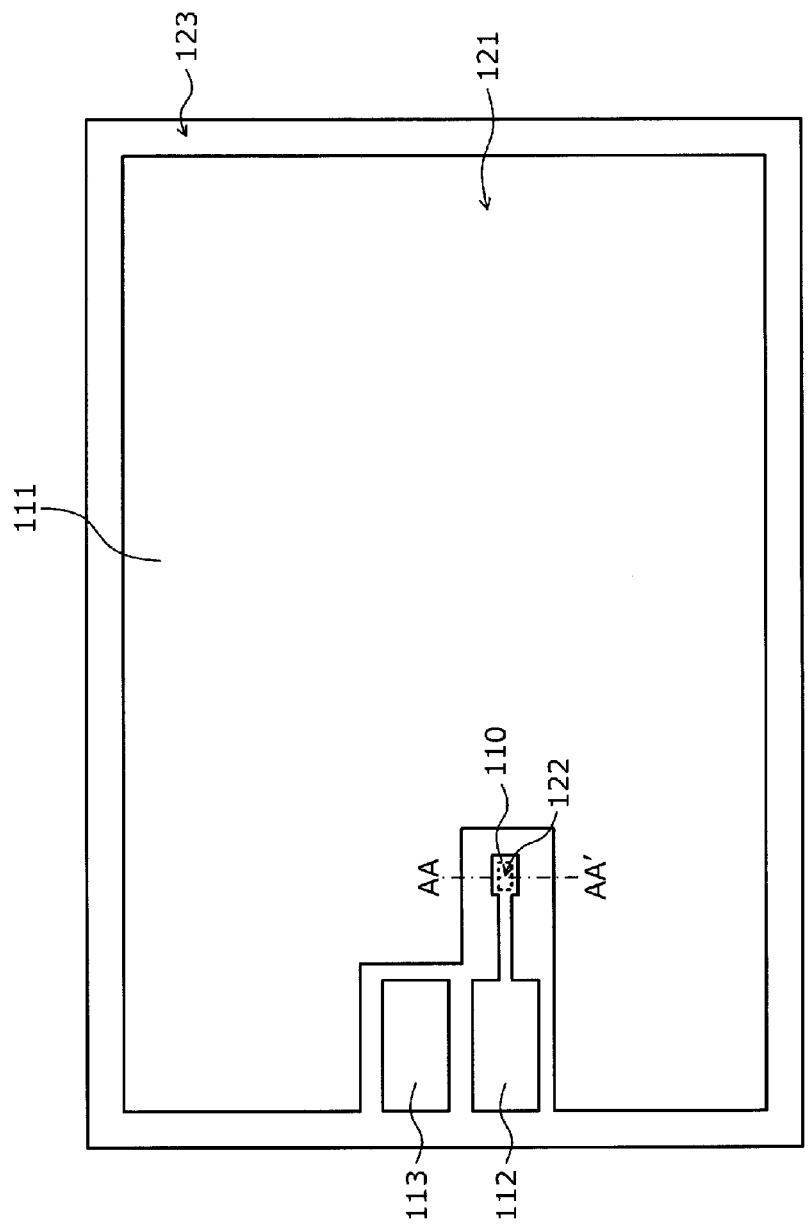
FIG. 10 is a plan view showing a planar layout of a background-art semiconductor device.
Figure 11:
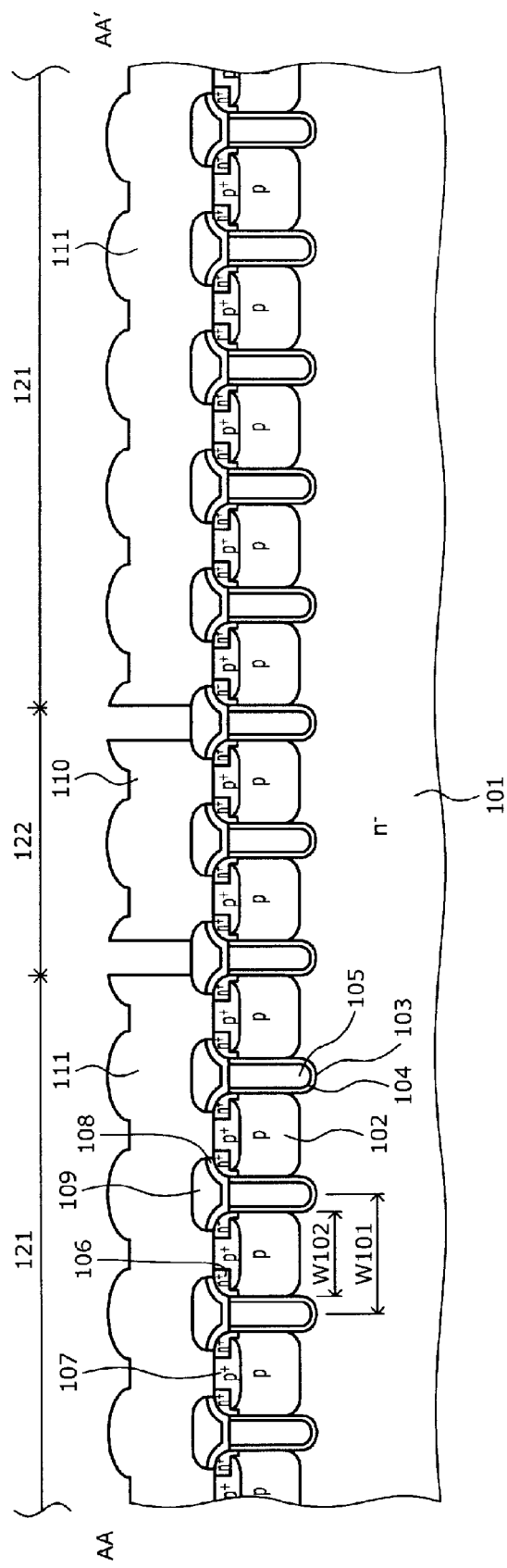
FIG. 11 is a sectional view showing a sectional structure in a cutting plane line AA-AA' of FIG. 10.
Figure 12:
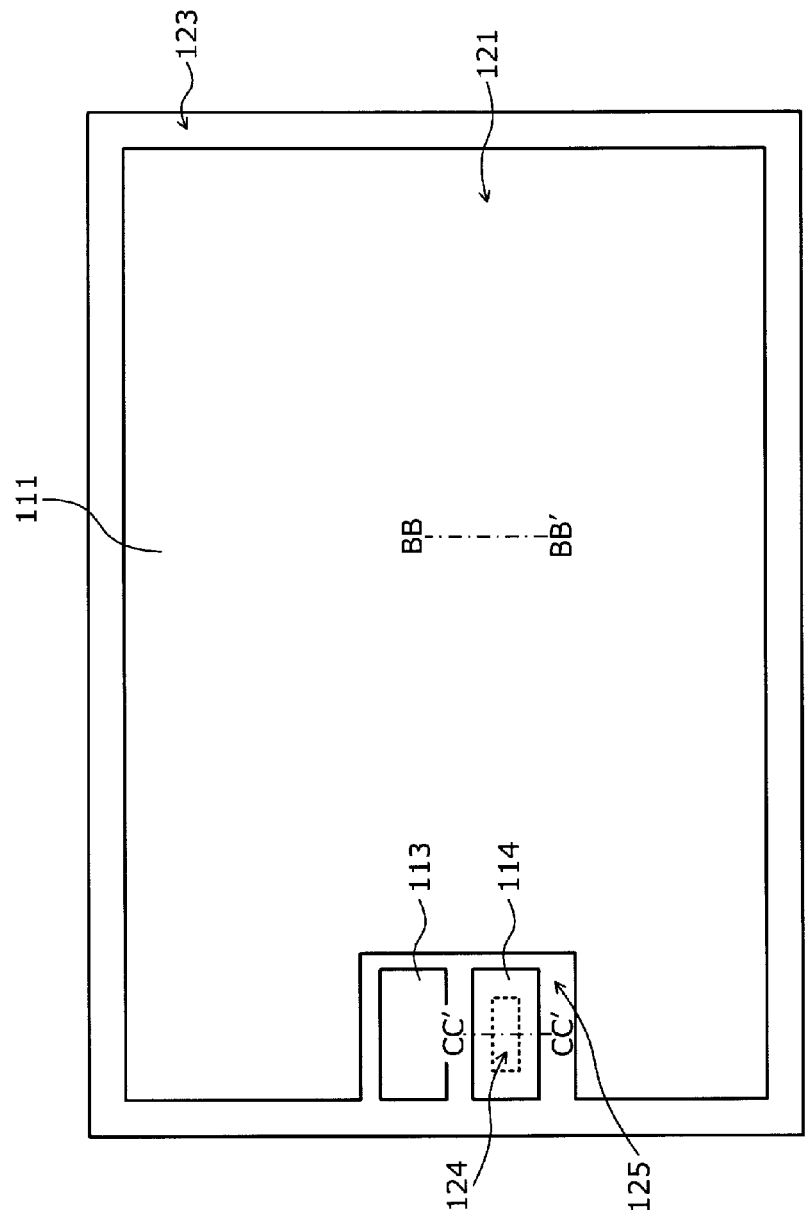
FIG. 12 is a plan view showing a planar layout of another example of the background-art semiconductor device.
Figure 13A:
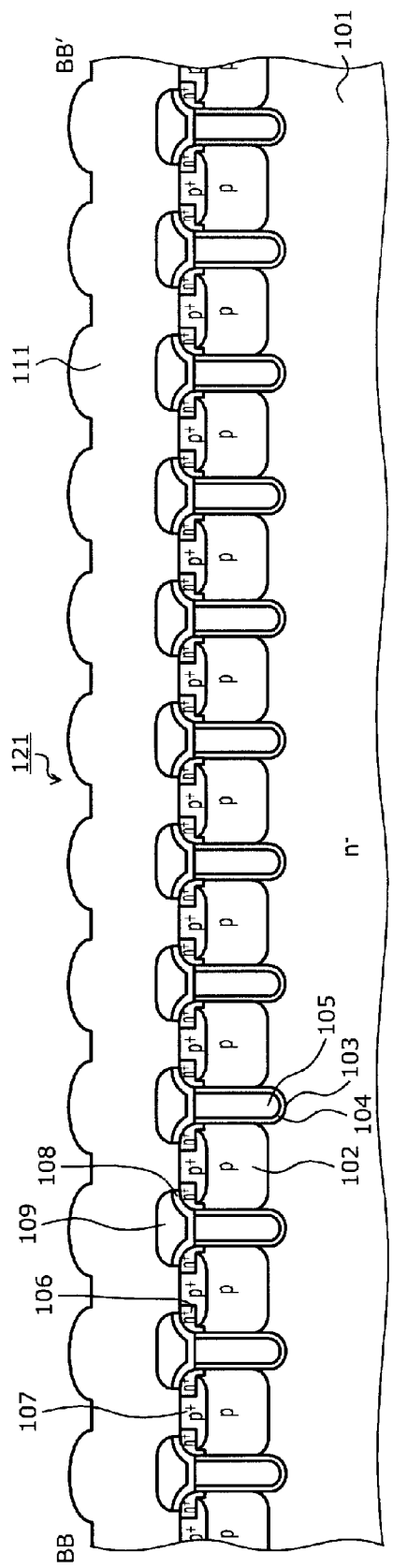
FIG. 13A is a sectional view showing a sectional structure in a cutting plane line BB-BB' of FIG. 12.
Figure 13B:
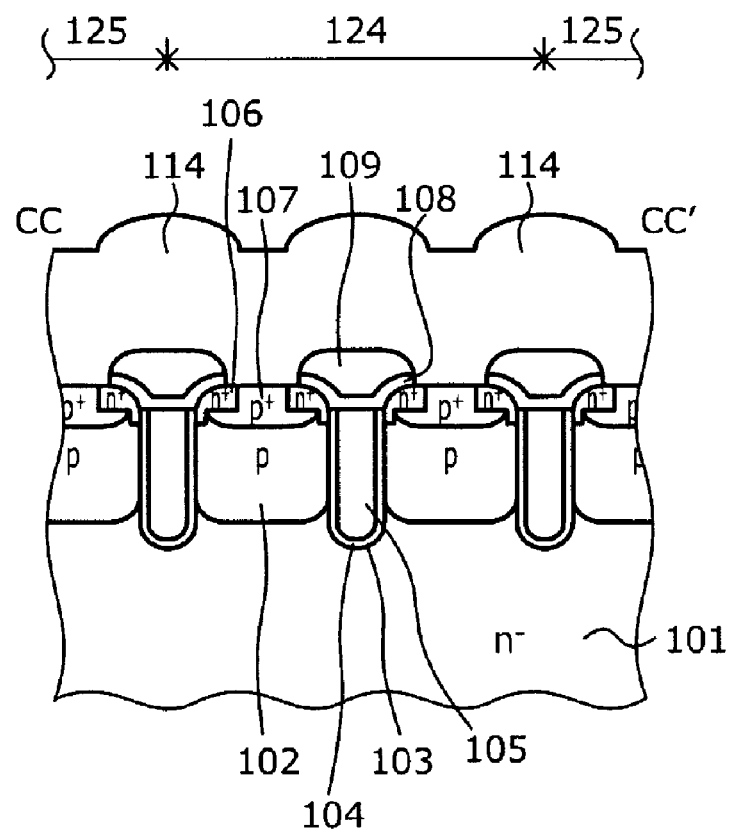
FIG. 13B is a sectional view showing sectional structures in a cutting plane line CC-CC' of FIG. 12.

Next, the structure of a semiconductor device according to Embodiment 6 will be described. FIG. 9 is a sectional view showing a sectional structure in a current sense region of the semiconductor device according to Embodiment 6. A planar layout of the semiconductor device and a sectional structure of an active region 21 according to Embodiment 6 are the same as those according to Embodiment 1 (see FIG. 1 and FIG. 2A). The semiconductor device according to Embodiment 6 is different from the semiconductor device according to Embodiment 1 in the point that the depth d21 of each trench 3b in the current sense region 22 is made shallower than the depth d11 of each trench 3a in the active region 21 (d21<d11). When the semiconductor device is microminiaturized, breakdown voltage can be improved as the depth of a portion of each trench protruding from the p-type base region toward the drain side is shallower.

That is, a depth d22 of a portion of each trench 3b which protrudes from the p-type base region 2 toward the drain side in the current sense region 22 is shallower than a depth d12 of a portion of each trench 3a protruding from the p-type base region 2 toward the drain side in the active region 21. Therefore, it is possible to make the breakdown voltage of the current sense region 22 higher than the breakdown voltage of the active region 21. For example, the depth d12 of the portion of the trench 3a which protrudes from the p-type base region 2 toward the drain side in the active region 21 may be not lower than about 0.6 μm and not higher than about 0.8 μm. For example, the depth d22 of the portion of the trench 3b which protrudes from the p-type base region 2 toward the drain side in the current sense region 22 may be about 0.3 μm.

In Embodiment 6, each trench 3a in the active region 21 and each trench 3b in the current sense region 22 are formed by the same etching step, as described above. In this case, for example, the width w11 of the trench 3a in the active region 21 is preferably not higher than about 1 μm. For example, the width w11 of the trench 3a in the active region 21 may be about 0.5 μm. The width w21 of the trench 3b in the current sense region 22 is narrower than the width w11 of the trench 3a in the active region 21, as described above. For example, the width w21 of the trench 3b in the current sense region 22 may be about 0.25 μm. The reason why the width w11 of the trench 3a in the active region 21 is set to be not higher than 1 μm is that the depth d21 of the trench 3b in the current sense region 22 can be made shallower than the depth d11 of the trench 3a in the active region 21 due to a micro loading effect.

The micro loading effect will be described. For example, assume that the width of the trench is not higher than about 1 μm. In this case, as the width of the trench is made narrower, etching gas having invaded inside the trench more hardly circulates to make the etching speed slower. As a result, the depth of the trench becomes shallower. On the other hand, as the width of the trench is made wider, etching gas having invaded inside the trench more easily circulates to make the etching speed faster. As a result, the depth of the trench becomes deeper. In Embodiment 6, the width w21 of the trench 3b in the current sense region 22 is narrower than the width w11 of the trench 3a in the active region 21 as described above. Accordingly, when the trenches 3a and 3b are formed by the same etching step, the depth d21 of the trench 3b in the current sense region 22 can be made shallower than the depth d11 of the trench 3a in the active region 21.

As the width w21 of the trench 3b in the current sense region 22 is made finer, the depth d21 of the trench 3b in the current sense region 22 becomes shallower due to the micro loading effect. Accordingly, it is possible to further increase the breakdown voltage of the current sense region 22. In the case where the width of the trench is larger than 1 μm, the depth of the trench becomes deeper as the width of the trench is made narrower. The depth of the trench becomes shallower as the width of the trench is made wider. Accordingly, the trench 3a in the active region 21 and the trench 3b in the current sense region 22 may be formed by different etching steps in this case.

Embodiments 2 and 3 may be applied to Embodiment 6 to have a configuration in which the mesa width w22 of each current sense cell is made narrower than the mesa width w12 of each active cell (w22<w12). In the configuration in which Embodiment 2 is applied to Embodiment 6, the width w21 of the trench 3b in the current sense region 22 and the width w11 of the trench 3a in the active region 21 become equal to each other (w21=w11). Therefore, in the case where Embodiment 2 is applied to Embodiment 6, for example, the trench 3a in the active region 21 and the trench 3b in the current sense region 22 may be formed by different etching steps. In addition, Embodiment 4 may be applied to Embodiment 6 to have a configuration in which only one side of each current sense cell operates as an MOSFET. In addition, Embodiment 5 may be applied to Embodiment 6 to have a configuration in which, of the gate insulating film 4 in the current sense region 22, the thickness of the portion which is provided in the bottom of the trench 3b is made thicker than the thickness of the portion which is provided in the bottom of the trench 3a, of the gate insulating film 4 in the active region 21.

As described above, according to Embodiment 6, it is possible to obtain a similar effect to that according to Embodiment 1.

In the above description, the invention may be changed variously without departing from the spirit and scope of the invention. In each of the aforementioned embodiments, for example, dimensions of each portion, concentration of impurities, etc. may be set variously in accordance with requested specifications etc. In addition, although an MOSFET has been described by way of example in each of the aforementioned embodiments, the invention can exert a similar effect also when the invention is applied to another MOS type semiconductor device such as an IGBT (Insulated Gate Bipolar Transistor). In addition, the breakdown voltage of each diode cell may be adjusted in such a manner that the mesa width of the diode cell is made narrower than the mesa width of the active cell and wider than the mesa width of the current sense cell, similarly to the aforementioned Embodiment 2. In addition, the breakdown voltage of the diode cell may be adjusted in such a manner that the cell pitch of the diode cell and the cell pitch of the current sense cell are made equal to each other while the trench width is narrowed and the mesa width is widened to thereby adjust the ratio of the mesa width. Further, the breakdown voltage of the diode cell may be adjusted in such a manner that the depth of the p-type base region or the $p^+$ type contact region is adjusted by diffusion, an implantation range, etc. In addition, the invention can be established in a similar manner even when the conductive type (n-type or p-type) is reversed.

As described above, the semiconductor device according to the invention is useful for a current-controllable semiconductor device provided with a current sense element. Particularly, the semiconductor device according to the invention is suitable to a semiconductor device in which breakdown voltage of an active region is not higher than about 100 V (for example, about 58 V) (the thickness of a gate insulating film in the active region is about 65 nm).

What is claimed is:

1. A semiconductor device, comprising:
    a semiconductor substrate;
    a main element provided on the semiconductor substrate and having a first trench gate structure including a first trench disposed on a first main surface side of the semiconductor substrate;
    a gate insulating film disposed along an inner wall of the first trench; and
    a gate electrode disposed inside the first trench; and
    a current detecting element for detecting a current flowing into the semiconductor substrate when the main element is operating provided on the semiconductor substrate side-by-side with the main element and having a second trench gate structure including a second trench disposed on the first main surface side of the semiconductor substrate;
    the gate insulating film disposed along an inner wall of the second trench; and the gate electrode disposed inside the second trench,
    wherein the first trench constituting the first trench gate structure of the main element and the second trench constituting the second trench gate structure of the current detecting element have respective widths, and the width of the second trench is less than the width of the first trench.

2. The semiconductor device according to claim 1, wherein the main element includes a plurality of first cells having respective widths and the first trench is interposed between adjacent ones of the first cells, the current detecting element includes a plurality of second cells having respective widths and the second trench is interposed between adjacent ones of the second cells;
    and the width of each of the second cells is less than the width of each of the first cells.

3. The semiconductor device according to claim 1, wherein the first trench and the second trench have respective depths, and the depth of the second trench is less than the depth of the first trench.

4. The semiconductor device according to claim 1, further comprising
    an active region;
    a current detecting region; and
    a diode region which are provided on the semiconductor substrate, the main element being disposed in the active region, the current detecting element being disposed in the current detecting region, and the diode region surrounding the current detecting region and having disposed therein a diode which is connected in anti-parallel with the current detecting element.

5. The semiconductor device according to claim 4, wherein the diode, the main element, and the current detecting element have a respective breakdown voltage, and the breakdown voltage of the diode is greater than the breakdown voltage of the main element but less than the breakdown voltage of the current detecting element.

6. The semiconductor device according to claim 1, wherein the gate insulating film is formed as an oxide film.

7. The semiconductor device according to claim 1, wherein the gate electrode is formed as a polysilicon layer.

8. A semiconductor device, comprising:
    a semiconductor substrate;
    a main element provided on the semiconductor substrate and having a first trench gate structure including a first trench disposed on a first main surface side of the semiconductor substrate;
    a gate insulating film disposed along an inner wall of the first trench; and a gate electrode disposed inside the first trench; and
    a current detecting element for detecting a current flowing into the semiconductor substrate when the main element is operating provided on the semiconductor substrate side-by-side with the main element and having a second trench gate structure including a second trench disposed on the first main surface side of the semiconductor substrate;
    the gate insulating film disposed along an inner wall of the second trench; and the gate electrode disposed inside the second trench,
    wherein the gate insulating film provided along the inner wall of the first trench constituting the first trench gate structure of the main element and the gate insulating film provided along the inner wall of the second trench constituting the second trench gate structure of the current detecting element have respective portions in the bottoms thereof having respective thicknesses, and the thickness of the portion of the gate insulating film provided in the bottom of the second trench is greater than the thickness of the portion of the gate insulating film provided in the bottom of the first trench, and
    wherein the main element includes a plurality of first cells having respective widths and the first trench is interposed between adjacent ones of the first cells, the current detecting element includes a plurality of second cells having respective widths and the second trench is interposed between adjacent ones of the second cells; and
    the width of each of the second cells is less than the width of each of the first cells.

9. The semiconductor device according to claim 8, wherein the first trench and the second trench have respective widths, and the width of the second trench is less than the width of the first trench.

10. The semiconductor device according to claim 8, wherein the first trench and the second trench have respective depths, and the depth of the second trench is less than the depth of the first trench.

11. The semiconductor device according to claim 8, further comprising
    an active region;
    a current detecting region; and
    a diode region which are provided on the semiconductor substrate, the main element being disposed in the active region, the current detecting element being disposed in the current detecting region, and the diode region surrounding the current detecting region and having disposed therein a diode which is connected in anti-parallel with the current detecting element.

12. The semiconductor device according to claim 11, wherein the diode, the main element, and the current detecting element have a respective breakdown voltage, and the breakdown voltage of the diode is greater than the breakdown voltage of the main element but less than the breakdown voltage of the current detecting element.

13. The semiconductor device according to claim 8, wherein the gate insulating film is formed as an oxide film.

14. The semiconductor device according to claim 8, wherein the gate electrode is formed as a polysilicon layer.

15. A semiconductor device, comprising:

a semiconductor substrate;

a main element provided on the semiconductor substrate and having a first trench gate structure including a first trench disposed on a first main surface side of the semiconductor substrate;

a gate insulating film disposed along an inner wall of the first trench;

a gate electrode disposed inside the first trench;

a current detecting element for detecting a current flowing into the semiconductor substrate when the main element is operating provided on the semiconductor substrate side-by-side with the main element and having a second trench gate structure including a second trench disposed on the first main surface side of the semiconductor substrate;

the gate insulating film disposed along an inner wall of the second trench; and the gate electrode disposed inside the second trench;

an active region;

a current detecting region; and a diode region which are provided on the semiconductor substrate, the main element being disposed in the active region, the current detecting element being disposed in the current detecting region, and the diode region surrounding the current detecting region and having disposed therein a diode which is connected in anti-parallel with the current detecting element.

16. The semiconductor device according to claim 15, wherein the first trench constituting the first trench gate structure of the main element and the second trench constituting the second trench gate structure of the current detecting element have respective widths, and the width of the second trench is less than the width of the first trench.

17. The semiconductor device according to claim 15, wherein the gate insulating film provided along the inner wall of the first trench constituting the first trench gate structure of the main element and the gate insulating film provided along the inner wall of the second trench constituting the second trench gate structure of the current detecting element have respective portions in the bottoms thereof having respective thicknesses, and the thickness of the portion of the gate insulating film provided in the bottom of the second trench is greater than the thickness of the portion of the gate insulating film provided in the bottom of the first trench.

* * * * *